United States Patent
Higuchi et al.

(10) Patent No.: US 12,552,662 B2
(45) Date of Patent: Feb. 17, 2026

(54) PACKAGE STRUCTURE AND METHOD FOR MANUFACTURING THE SAME

(71) Applicant: Murata Manufacturing Co., Ltd., Nagaokakyo (JP)

(72) Inventors: Yoshiyuki Higuchi, Nagaokakyo (JP); Masakazu Fukumitsu, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 1047 days.

(21) Appl. No.: 17/666,746

(22) Filed: Feb. 8, 2022

(65) Prior Publication Data
US 2022/0153573 A1   May 19, 2022

Related U.S. Application Data

(63) Continuation of application No. PCT/JP2020/016868, filed on Apr. 17, 2020.

(30) Foreign Application Priority Data

Sep. 5, 2019   (JP) .................................. 2019-161715

(51) Int. Cl.
*B81B 7/00*    (2006.01)
*B81C 1/00*    (2006.01)
(Continued)

(52) U.S. Cl.
CPC ........ *B81B 7/0038* (2013.01); *B81C 1/00285* (2013.01); *H03H 9/05* (2013.01); *H03H 9/17* (2013.01); *H03H 2009/155* (2013.01)

(58) Field of Classification Search
CPC .. H03H 9/2489; H03H 9/1057; H03H 9/0595; H03H 9/17; H03H 9/05; B81B 2201/025; B81B 7/0038; B81C 1/00285
See application file for complete search history.

(56) References Cited

U.S. PATENT DOCUMENTS

| | | | |
|---|---|---|---|
| 9,139,424 | B2 | 9/2015 | Nicolas et al. |
| 2014/0038364 | A1 | 2/2014 | Nicolas et al. |

(Continued)

FOREIGN PATENT DOCUMENTS

| | | |
|---|---|---|
| CN | 103569949 A | 2/2014 |
| JP | 2000133816 A * | 5/2000 |

(Continued)

OTHER PUBLICATIONS

International Search Report issued for PCT/JP2020/016868, date of mailing Jul. 21, 2020.

*Primary Examiner* — J. San Martin
(74) *Attorney, Agent, or Firm* — ArentFox Schiff LLP

(57) ABSTRACT

A package structure that includes a pair of substrates arranged to oppose each other so as to form an internal space; a bonding portion sealing the pair of substrates; an element is sealed in the internal space and surrounded by the pair of substrates; an adsorption layer within the internal space and opposing at least one substrate of the pair of substrates, the adsorption layer constructed to adsorbs at least hydrogen; and a diffusion-inhibiting layer between the at least one substrate and the adsorption layer, and in which hydrogen is more difficult to diffuse compared with in the at least one substrate.

20 Claims, 13 Drawing Sheets

(51) Int. Cl.
*H03H 9/05* (2006.01)
*H03H 9/15* (2006.01)
*H03H 9/17* (2006.01)

(56) References Cited

U.S. PATENT DOCUMENTS

| | | |
|---|---|---|
| 2018/0024159 A1 | 1/2018 | Takahata et al. |
| 2018/0226937 A1* | 8/2018 | Umeda ................ H03H 9/0561 |
| 2020/0290865 A1 | 9/2020 | Umeda et al. |

FOREIGN PATENT DOCUMENTS

| | | | |
|---|---|---|---|
| JP | 2016072336 A | * | 5/2016 |
| JP | 2021145072 A | * | 9/2021 |
| WO | 2016129230 A1 | | 8/2016 |
| WO | 2019155663 A1 | | 8/2019 |

* cited by examiner

FIG. 1
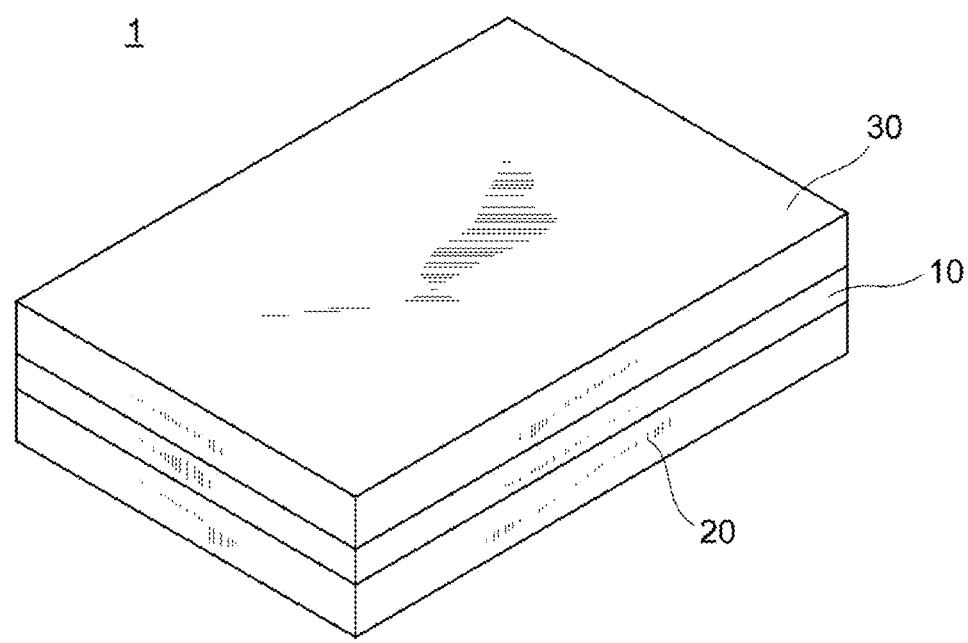
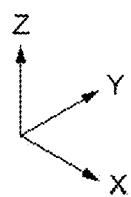

PACKAGE STRUCTURE AND METHOD FOR MANUFACTURING THE SAME

CROSS REFERENCE TO RELATED APPLICATIONS

The present application is a continuation of International application No. PCT/JP2020/016868, filed Apr. 17, 2020, which claims priority to Japanese Patent Application No. 2019-161715, filed Sep. 5, 2019, the entire contents of each of which are incorporated herein by reference.

FIELD OF THE INVENTION

The present invention relates to a package structure and a method for manufacturing the same.

BACKGROUND OF THE INVENTION

Electronic elements, mechanical elements, optical elements, and the like may undergo deterioration in their performance due to contact with oxygen or water vapor and, therefore, are housed in, for example, an internal space of a hermetically sealed package structure. In such an instance, to increase the degree of vacuum in the internal space, a layer called a getter for adsorbing a gas molecule may be disposed in the internal space.

For example, Patent Document 1 discloses a package structure including a lower lid constituting a MEMS substrate in combination with a resonator, an upper lid that forms a vibration space of the resonator between the lower lid and the upper lid, and a getter layer that is disposed on the upper lid so as to be located in the internal space and that adsorbs an out gas. The getter layer being disposed in the internal space of the package structure, as described above, enables the degree of vacuum in the internal space to be increased and reduces deterioration of the performance of the element. In particular, regarding a piezoelectric vibration element exploiting a piezoelectric effect, as described in Patent Document 1, adsorption of gas molecules can suppress the frequency characteristics from fluctuating.

Patent Document 1: International Publication No. 2019/155663

SUMMARY OF THE INVENTION

However, regarding the package structure described in Patent Document 1, when hydrogen contained in a substrate constituting the upper lid enters the getter layer so as to increase the amount of hydrogen stored in the getter layer, a desorption reaction of hydrogen from the getter layer may occur so that a high degree of vacuum is not maintained.

The present invention was realized in consideration of such circumstances, and it is an object of the present invention to provide a package structure capable of readily maintaining a high degree of vacuum and to provide a method for manufacturing the same.

A package structure according to an aspect of the present invention includes: a pair of substrates arranged to oppose each other so as to form an internal space; a bonding portion sealing the pair of substrates; an element sealed in the internal space and surrounded by the pair of substrates; an adsorption layer within the internal space and opposing at least one substrate of the pair of substrates, the adsorption layer constructed to adsorbs at least hydrogen; and a diffusion-inhibiting layer which between the at least one substrate and the adsorption layer, and in which hydrogen is more difficult to diffuse compared with in the at least one substrate.

A method for manufacturing a package structure according to an aspect of the present invention includes: forming an adsorption layer which adsorbs at least hydrogen on at least one substrate of a pair of substrates; forming, on the at least one substrate, a diffusion-inhibiting layer in which hydrogen is more difficult to diffuse compared with in the at least one substrate; arranging the pair of substrates such that the adsorption layer on the at least one substrate opposes the other substrate; and sealing an element in an internal space surrounded by the pair of substrates by forming a bonding portion between the pair of substrates.

According to the present invention, a package structure capable of readily maintaining a high degree of vacuum and a method for manufacturing the same are provided.

BRIEF DESCRIPTION OF THE DRAWINGS

FIG. 1 is a schematic perspective view illustrating the appearance of a resonance device according to a first embodiment.

DETAILED DESCRIPTION OF THE PREFERRED EMBODIMENTS

The embodiments according to the present invention will be described below with reference to the drawings. The drawings of each embodiment are just examples, the dimension and the shape of each portion are schematic, and it should be understood that the technical scope of the present invention is not limited to the embodiments.

Regarding an embodiment according to the present invention, a resonance device incorporating a MEMS resonator will be described as an example. The MEMS resonator corresponds to an element that is housed in a package structure according to an embodiment of the present invention, and an upper lid and a lower lid correspond to a pair of substrates constituting the package structure according to an embodiment of the present invention. However, the package structure according to an embodiment of the present invention is not limited to the MEMS resonator, provided that the element which requires a high degree of vacuum or a low hydrogen partial pressure is housed in an internal space, and can be appropriately applied to various electronic elements, optical elements, mechanical elements, and the like.

First Embodiment

Figure 2:
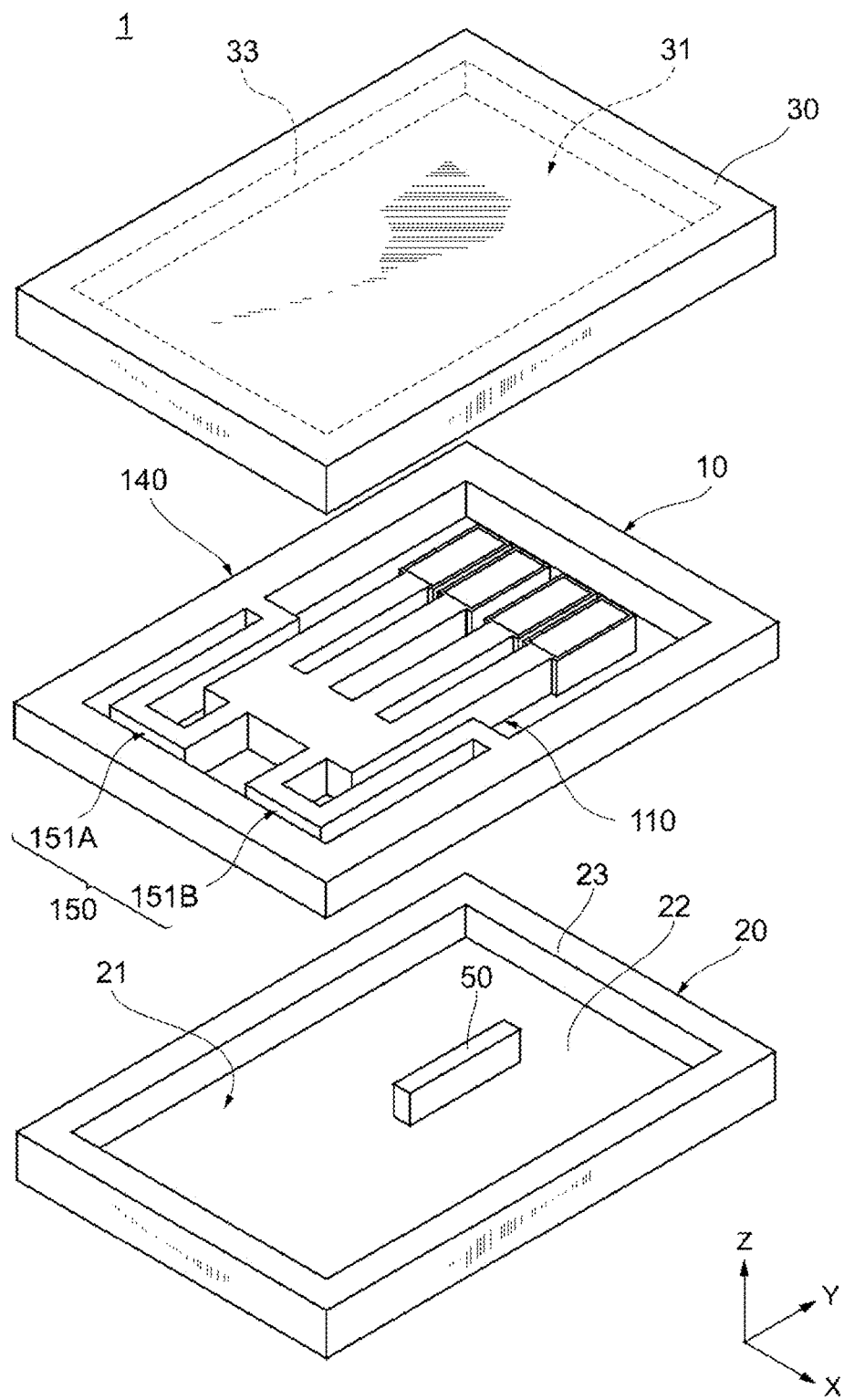
FIG. 2 is a schematic exploded perspective view illustrating the structure of the resonance device according to the first embodiment.

To begin with, the configuration of a resonance device 1 according to a first embodiment of the present invention will be described with reference to FIG. 1 and FIG. 2. FIG. 1 is a schematic perspective view illustrating the appearance of the resonance device according to the first embodiment. FIG. 2 is a schematic exploded perspective view illustrating the structure of the resonance device according to the first embodiment.

Each configuration of the resonance device 1 will be described below. Each drawing may be provided with an orthogonal coordinate system temporarily composed of the X-axis, the Y-axis, and the Z-axis for the sake of clarifying the relationship between the drawings and facilitating understanding the positional relationship between the members. The directions parallel to the X-axis, the Y-axis, and the Z-axis are referred to as the X-axis direction, the Y-axis direction, and the Z-axis direction, respectively. The plane specified by the X-axis and the Y-axis is referred to as the XY plane, and the same applies to the YZ plane and the ZX plane. In this regard, in the following description, the direction parallel to the Z-axis and in accord with the direction of the arrow indicating the Z-axis (+Z-axis direction) is denoted as an upward direction, and the direction parallel to the Z-axis and opposite to the direction of the arrow indicating the Z-axis (−Z-axis direction) is denoted as a downward direction.

The resonance device 1 includes a resonator 10 and includes a lower lid 20 and an upper lid 30 disposed to oppose each other with the resonator 10 interposed therebetween. The lower lid 20, the resonator 10, and the upper lid 30 are stacked in this order in the Z-axis direction. The resonator 10 is bonded to the lower lid 20, and the resonator 10 is bonded to the upper lid 30. A vibration space of the resonator 10 is formed between the lower lid 20 and the upper lid 30 bonded to each other with resonator 10 interposed therebetween. In other words, the lower lid 20 and the upper lid 30 are indirectly bonded to each other and form the internal space for housing the resonator 10 corresponding to a piezoelectric vibration element. Consequently, the lower lid 20 and the upper lid 30 form a package structure for housing the resonator 10.

The resonator 10 is a MEMS resonance element produced by using the MEMS technology. The resonator 10 includes a vibration portion 110, a supporting portion 140, and a supporting arm 150. The vibration portion 110 is supported in the vibration space. There is no particular limitation regarding the vibration mode of the vibration portion 110. For example, the mode may be an out-of-plane bending vibration mode with respect to the XY plane or may be an in-plane bending vibration mode with respect to the XY plane. The supporting portion 140 is disposed having the shape of, for example, a rectangular frame so as to surround the vibration portion 110. The supporting arm 150 connects the vibration portion 110 to the supporting portion 140.

The frequency band of the resonator 10 is, for example, 1 kHz to 1 MHz. Regarding the vibration mode of such a resonator 10, fluctuation of the frequency due to a change in the mass of the vibration portion 110 is large. Consequently, the degree of vacuum in the vibration space of the resonance device 1 being increased enables a deviation of the initial frequency and a change over time of the frequency to be reduced.

The lower lid 20 has a rectangular plate-like bottom plate 22 disposed along the XY plane and a side wall 23 extending from the peripheral edge portion of the bottom plate 22 in the Z-axis direction. The side wall 23 is bonded to the supporting portion 140 of the resonator 10. A recessed portion 21 delimited by the bottom plate 22 and the side wall 23 is formed on the surface of the lower lid 20 opposing the vibration portion 110 of the resonator 10. The recessed portion 21 is a rectangular parallelepiped cavity opened upward and forms a portion of the vibration space of the resonator 10. In other words, the lower lid 20 has an inner wall 25 constituting the recessed portion 21, and the recessed portion 21 corresponds to a portion of the internal space of the package structure. Regarding the inner surface of the lower lid 20, a protrusion portion 50 that protrudes into the vibration space is formed on the upper surface of the bottom plate 22.

The structure of the upper lid 30 and the structure of the lower lid 20 are symmetric with respect to the resonator 10 except the protrusion portion 50 disposed on the lower lid 20. That is, the upper lid 30 has a rectangular plate-like bottom plate 32 disposed along the XY plane and a side wall 33 extending from the peripheral edge portion of the bottom plate 32 in the Z-axis direction, and the side wall 33 is bonded to the supporting portion 140 of the resonator 10. A recessed portion 31 is formed on the surface of the upper lid 30 opposing the vibration portion 110 of the resonator 10. The recessed portion 31 is a rectangular parallelepiped cavity opened downward and forms a portion of the vibration space of the resonator 10. In other words, the upper lid 30 has an inner wall 35 constituting the recessed portion 31, and the recessed portion 31 corresponds to a portion of the internal space of the package structure.

In this regard, the structure of the lower lid 20 and the structure of the upper lid 30 are not limited to the above-described aspect, and the two may be mutually asymmetric. For example, one of the lower lid 20 and the upper lid 30 may have a dome-like shape. The shapes of the recessed portion 21 of the lower lid 20 and the recessed portion 31 of the upper lid 30 may differ from each other, and, for example, the depths of the recessed portion 21 and the recessed portion 31 may differ from each other.

Figure 3:
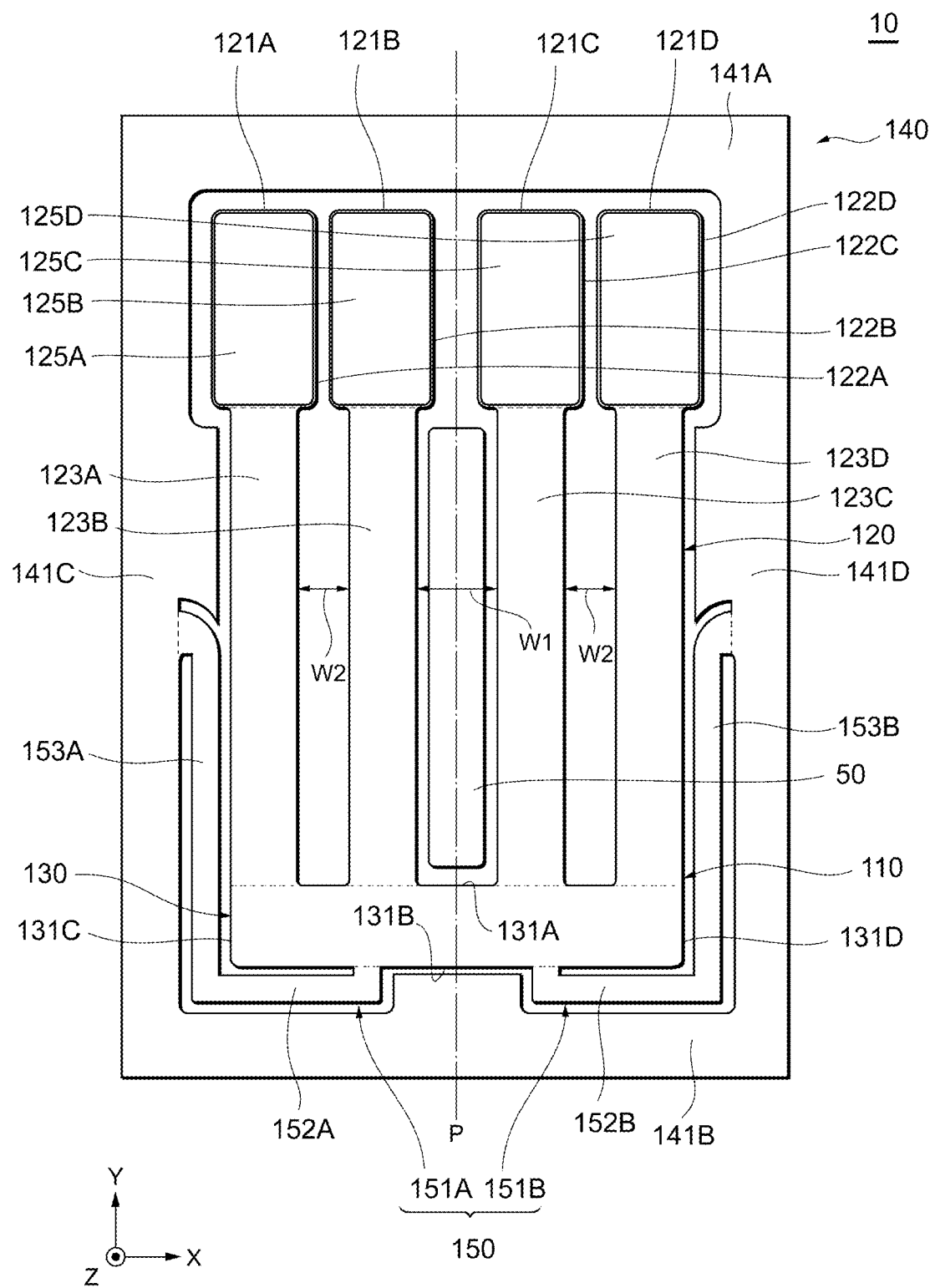
FIG. 3 is a schematic plan view illustrating the structure of a resonator according to the first embodiment.

Next, the configurations of the vibration portion 110, the supporting portion 140, and the supporting arm 150 of the resonator 10 according to the embodiment of the present invention will be described in more detail with reference to FIG. 3. FIG. 3 is a schematic plan view illustrating the structure of the resonator according to the first embodiment.

The vibration portion 110 is disposed inside the supporting portion 140 in a plan view from the upper lid 30 side. A space is formed between the vibration portion 110 and the supporting portion 140 at a predetermined interval. The vibration portion 110 has an excitation portion 120 composed of four vibration arms 121A, 121B, 121C, and 121D and a base portion 130 connected to the excitation portion 120. In this regard, the number of the vibration arms is not limited to four and may be set to be any number of one or more. In the present embodiment, the excitation portion 120 and the base portion 130 are integrally formed.

Each of the vibration arms 121A, 121B, 121C, and 121D extends in the Y-axis direction and is disposed side by side in this order at predetermined intervals in the X-axis direction. One end of the vibration arm 121A is a fixed end connected to a front end portion 131A of the base portion 130 described later, and the other end of the vibration arm 121A is an open end disposed apart from the front end portion 131A of the base portion 130. The vibration arm 121A has a mass-loaded portion 122A and an arm portion 123A aligned in the extension direction of the vibration arm 121A. The mass-loaded portion 122A is disposed on the open-end side, and the arm portion 123A extends from the fixed end and is connected to the mass-loaded portion 122A. In other words, the mass-loaded portion 122A is disposed at the position at which a displacement is relatively large in the vibration portion 110. The vibration arms 121B, 121C, and 121D also have mass-loaded portions 122B, 122C, and 122D, respectively, and arm portions 123B, 123C, and 123D, respectively. In this regard, each of the arm portions 123A to 123D has, for example, a width in the X-axis direction of about 50 µm and a length in the Y-axis direction of about 450 µm.

Of the four vibration arms, the vibration arms 121A and 121D are outer vibration arms arranged in the outer-side portions in the X-axis direction. On the other hand, the vibration arms 121B and 121C are inner vibration arms arranged in the inner-side portions in the X-axis direction. In an example, the width (hereafter referred to as a "release width") W1 of a gap formed between the arm portion 123B and the arm portion 123C of the inner vibration arm 121B and the inner vibration arm 121C, respectively, is set to be larger than the release width W2 between the arm portion 123A and the arm portion 123B of the outer vibration arm 121A and the inner vibration arm 121B, respectively, adjoining in the X-axis direction and the release width W2 between the arm portion 123D and the arm portion 123C of the outer vibration arm 121D and the inner vibration arm 121C, respectively, adjoining in the X-axis direction. The vibration characteristics and the durability are improved by setting the release width W1 to be larger than the release width W2, as described above. There is no limitation regarding the numerical values of the release width W1 and the release width W2, and, for example, the release width W1 is about 25 µm, and the release width W2 is about 10 µm. In this regard, the release width W1 between the inner vibration arms and the release width W2 between the inner vibration arm and the outer vibration arm are not limited to the aspect illustrated in FIG. 3. The release width W1 may be set to be smaller than the release width W2, or these may be set to be an equal interval.

The mass-loaded portions 122A to 122D are provided with mass-loading films 125A to 125D, respectively, on their respective surfaces. In other words, in the plan view from the upper lid 30 side, the portions at which the mass-loading films 125A to 125D are located are the mass-loaded portions 122A to 122D, respectively. The weight per unit length (hereafter also simply referred to as "weight") of each of the mass-loaded portions 122A to 122D is larger than the weight of the arm portions 123A to 123D, respectively, since the mass-loading films 125A to 125D, respectively, are included. Consequently, the vibration characteristics can be improved while the vibration portion 110 is reduced in size. In addition, the mass-loading films 125A to 125D have not only a function of increasing the weight of the end portions of the vibration arms 121A to 121D but also a function of adjusting the resonant frequencies of the vibration arms 121A to 121D, that is, so-called a frequency adjusting film, by being partly cut.

In the present embodiment, the width in the X-axis direction of each of the mass-loaded portions 122A to 122D is larger than the width in the X-axis direction of each of the arm portions 123A to 123D. Consequently, the weight of each of the mass-loaded portions 122A to 122D can be further increased. However, the width in the X-axis direction of each of the mass-loaded portions 122A to 122D is not limited to the above, provided that the weight per unit length of each of the mass-loaded portions 122A to 122D is larger than the weight per unit length of each of the arm portions 123A to 123D. The width in the X-axis direction of each of the mass-loaded portions 122A to 122D may be equivalent to or less than or equal to the width in the X-axis direction of each of the arm portions 123A to 123D.

In the plan view from the upper lid 30 side, the shape of each of the mass-loaded portions 122A to 122D is a substantially rectangular shape having a curved shape in which four corners are rounded (for example, a so-called R-shape). The shape of each of the arm portions 123A to 123D is a substantially rectangular shape having R-shapes in the vicinity of the fixed end connected to the base portion 130 and in the vicinity of the connection portion connected to each of the mass-loaded portions 122A to 122D. However, the shape of each of the mass-loaded portions 122A to 122D and the arm portions 123A to 123D is not limited to the above. For example, the shape of each of the mass-loaded portions 122A to 122D may be the shape of a trapezoid or the shape of the letter L. In this regard, the shape of each of the arm portions 123A to 123D may be the shape of a trapezoid, or a slit or the like may be formed.

In the plan view from the upper lid 30 side, the protrusion portion 50 protruding from the lower lid 20 is disposed between the arm portions 123B and 123C of the inner vibration arms 121B and 121C, respectively. The protrusion portion 50 extends parallel to the arm portions 123B and 123C in the Y-axis direction. The length in the Y-axis direction of the protrusion portion 50 is about 240 µm, and the length in the X-axis direction is about 15 µm. The protrusion portion 50 being disposed suppresses torsion of the lower lid 20 from occurring.

As illustrated in FIG. 3, in the plan view from the upper lid 30 side, the base portion 130 has the front end portion 131A, a rear end portion 131B, a left end portion 131C, and a right end portion 131D. Each of the front end portion 131A, the rear end portion 131B, the left end portion 131C, and the right end portion 131D is a portion of the outer edge portion of the base portion 130. Specifically, the front end portion 131A is an end portion extending in the X-axis direction on the vibration arms 121A to 121D side. The rear end portion 131B is an end portion extending in the X-axis direction on the opposite side of the vibration arms 121A to 121D. The left end portion 131C is an end portion extending in the Y-axis direction on the vibration arm 121A side when viewed from the vibration arm 121D. The right end portion 131D is an end portion extending in the Y-axis direction on the vibration arm 121D side when viewed from the vibration arm 121A.

One end of the left end portion 131C is connected to one end of the front end portion 131A, and the other end is connected to one end of the rear end portion 131B. One end of the right end portion 131D is connected to the other end of the front end portion 131A, and the other end is connected to the other end of the rear end portion 131B. The front end portion 131A and the rear end portion 131B are opposite each other in the Y-axis direction. The left end portion 131C and the right end portion 131D are opposite each other in the X-axis direction. The front end portion 131A is connected to the vibration arms 121A to 121D.

In the plan view from the upper lid 30 side, the shape of the base portion 130 is a substantially rectangular shape in which the front end portion 131A and the rear end portion 131B are long sides, and the left end portion 131C and the right end portion 131D are short sides. The base portion 130 is formed to become substantially symmetric with respect to a virtual plane P demarcated by perpendicular bisectors of the front end portion 131A and the rear end portion 131B. In this regard, the base portion 130 is not limited to having a rectangular shape illustrated in FIG. 3 and may have other shapes that are substantially symmetric with respect to the virtual plane P. For example, the shape of the base portion 130 may be a trapezoidal shape in which one of the front end portion 131A and the rear end portion 131B is longer than the other. Alternatively, at least one of the front end portion 131A, the rear end portion 131B, the left end portion 131C, and the right end portion 131D may be bent or curved.

In this regard, the virtual plane P corresponds to a plane of symmetry of the entire vibration portion 110. Therefore, the virtual plane P is also a plane passing through the centers of the vibration arms 121A to 121D in the X-axis direction and is located between the inner vibration arm 121B and the inner vibration arm 121C. Specifically, the outer vibration arm 121A and the inner vibration arm 121B adjacent to each other and the outer vibration arm 121D and the inner vibration arm 121C, respectively, adjacent to each other are formed to become symmetric with respect to the virtual plane P.

Regarding the base portion 130, an example of the base portion length that is the longest distance between the front end portion 131A and the rear end portion 131B in the Y-axis direction is about 40 μm. In addition, an example of the base portion width that is the longest distance between the left end portion 131C and the right end portion 131D in the X-axis direction is about 300 μm. In this regard, in the configuration example illustrated in FIG. 3, the base portion length corresponds to the length of the left end portion 131C or the right end portion 131D, and the base portion width corresponds to the length of the front end portion 131A or the rear end portion 131B.

The supporting portion 140 is a portion to support the vibration portion 110 in the vibration space formed by the lower lid 20 and the upper lid 30 and, for example, surrounds the vibration portion 110. As illustrated in FIG. 3, in the plan view from the upper lid 30 side, the supporting portion 140 has a front frame 141A, a rear frame 141B, a left frame 141C, and a right frame 141D. Each of the front frame 141A, the rear frame 141B, the left frame 141C, and the right frame 141D is a portion of a substantially rectangular frame body surrounding the vibration portion 110. Specifically, the front frame 141A is a portion extending in the X-axis direction on the excitation portion 120 side when viewed from the base portion 130. The rear frame 141B is a portion extending in the X-axis direction on the base portion 130 side when viewed from the excitation portion 120. The left frame 141C is a portion extending in the Y-axis direction on the vibration arm 121A side when viewed from the vibration arm 121D. The right frame 141D is a portion extending in the Y-axis direction on the vibration arm 121D side when viewed from the vibration arm 121A. The supporting portion 140 is formed to become symmetric with respect to the virtual plane P.

One end of the left frame 141C is connected to one end of the front frame 141A, and the other end is connected to one end of the rear frame 141B. One end of the right frame 141D is connected to the other end of the front frame 141A, and the other end is connected to the other end of the rear frame 141B. The front frame 141A and the rear frame 141B are opposite each other with the vibration portion 110 interposed therebetween in the Y-axis direction. The left frame 141C and the right frame 141D are opposite each other with the vibration portion 110 interposed therebetween in the X-axis direction. In this regard, the supporting portion 140 has to be disposed as at least a portion of the surrounding of the vibration portion 110 and is not limited to have a continuous frame-like shape in the circumferential direction.

The supporting arm 150 is disposed inside the supporting portion 140 and connects the base portion 130 to the supporting portion 140. As illustrated in FIG. 3, in the plan view from the upper lid 30 side, the supporting arm 150 has a left supporting arm 151A and a right supporting arm 151B. The left supporting arm 151A connects the rear end portion 131B of the base portion 130 to the left frame 141C of the supporting portion 140. The right supporting arm 151B connects the rear end portion 131B of the base portion 130 to the right frame 141D of the supporting portion 140. The left supporting arm 151A has a supporting rear arm 152A and a supporting side arm 153A, and the right supporting arm 151B has a supporting rear arm 152B and a supporting side arm 153B. The supporting arm 150 is formed to become symmetric with respect to the virtual plane P.

The supporting rear arms 152A and 152B extend between the rear end portion 131B of the base portion 130 and the supporting portion 140 from the rear end portion 131B of the base portion 130. Specifically, the supporting rear arm 152A extends from the rear end portion 131B of the base portion 130 toward the rear frame 141B and is bent and extends toward the left frame 141C. The supporting rear arm 152B extends from the rear end portion 131B of the base portion 130 toward the rear frame 141B and is bent and extends toward the right frame 141D.

The supporting side arm 153A extends parallel to the outer vibration arm 121A between the outer vibration arm 121A and the supporting portion 140. The supporting side arm 153B extends parallel to the outer vibration arm 121D between the outer vibration arm 121D and the supporting portion 140. Specifically, the supporting side arm 153A extends from the left frame 141C side end portion of the supporting rear arm 152A toward the front frame 141A and is bent and connected to the left frame 141C. The supporting side arm 153B extends from the right frame 141D side end portion of the supporting rear arm 152B toward the front frame 141A and is bent and connected to the right frame 141D.

In this regard, the supporting arm 150 is not limited to the above-described configuration. For example, the supporting arm 150 may be connected to the left end portion 131C and the right end portion 131D of the base portion 130. Alternatively, the supporting arm 150 may be connected to the front frame 141A of the supporting portion 140.

Figure 4:
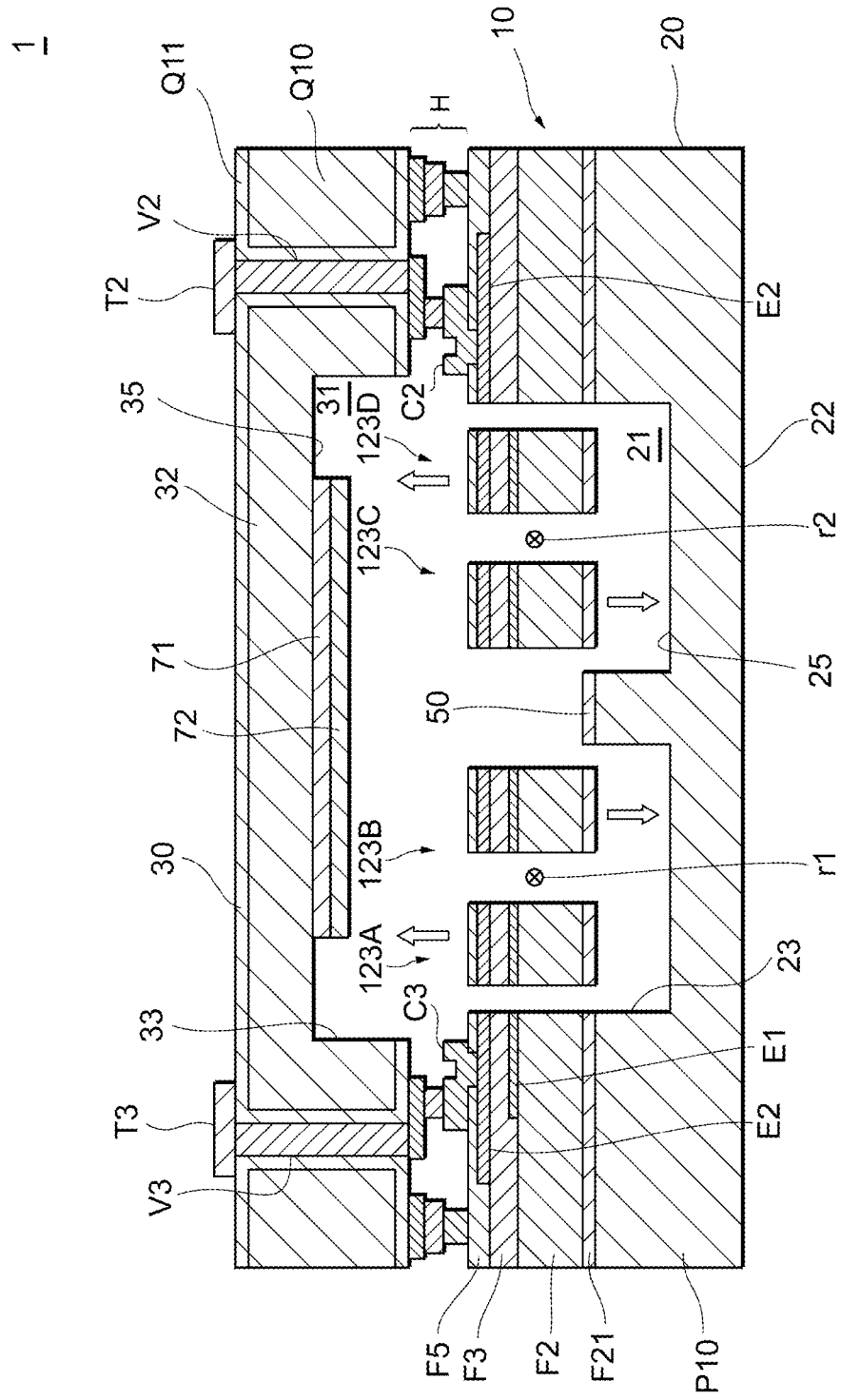
FIG. 4 is a sectional view conceptually illustrating the stacking structure of the resonance device along the X-axis in FIG. 1.
Figure 5:
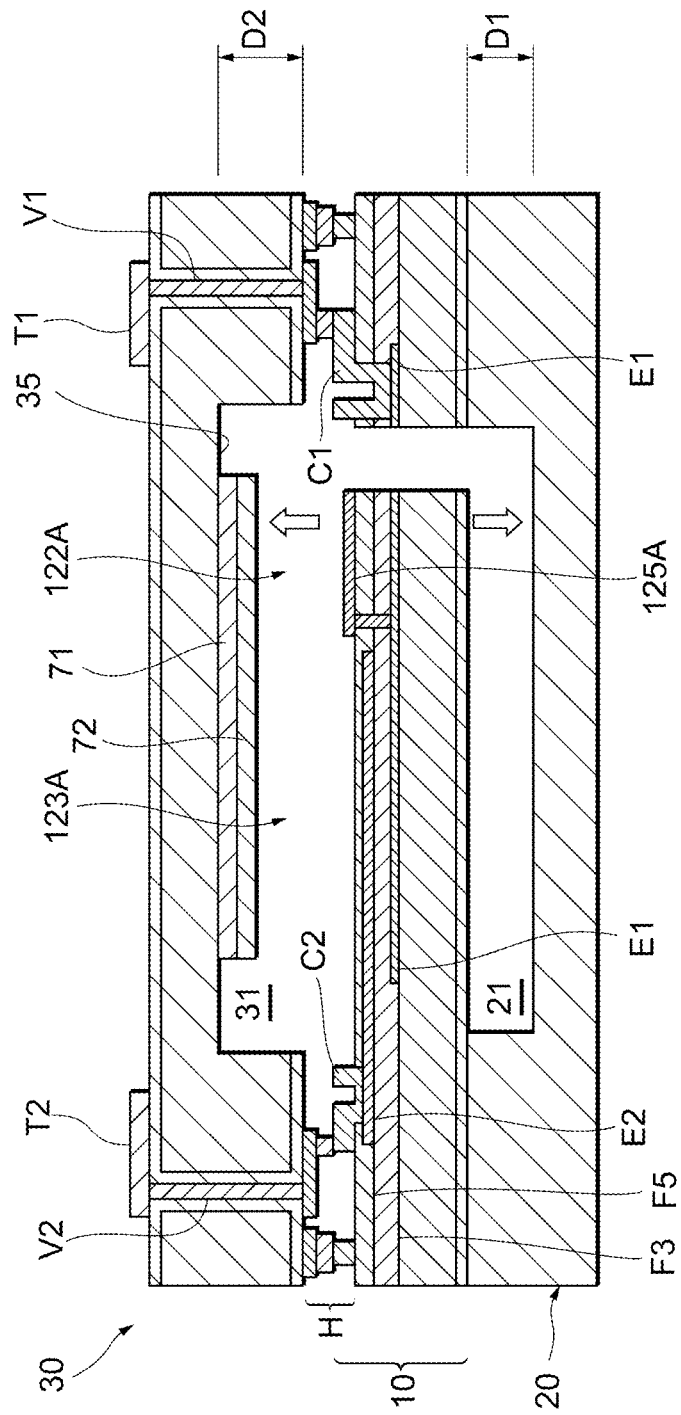
FIG. 5 is a sectional view conceptually illustrating the stacking structure of the resonance device along the Y-axis in FIG. 1.

Next, the stacking structure of the resonance device 1 according to the first embodiment will be described with reference to FIG. 4 and FIG. 5. FIG. 4 is a sectional view conceptually illustrating the stacking structure of the resonance device along the X-axis in FIG. 1. FIG. 5 is a sectional view conceptually illustrating the stacking structure of the resonance device along the Y-axis in FIG. 1. In this regard, FIG. 4 just schematically illustrates the cross sections of the arm portions 123A to 123D, extended wires C2 and C3, through electrodes V2 and V3, and the like for the purpose of explaining the stacking structure of the resonance device 1, and these are not limited to being located on the cross sections in the same plane. For example, the through electrodes V2 and V3 may be disposed at the positions apart, in the Y-axis direction, from a cross section that is parallel to the ZX plane demarcated by the Z-axis and the X-axis and that crosses the arm portions 123A to 123D. In the same manner, FIG. 5 just schematically illustrates the cross sections of the mass-loaded portion 122A, the arm portion 123A, extended wires C1 and C2, through electrodes V1 and V2, and the like for the purpose of explaining the stacking structure of the resonance device 1, and these are not limited to being located on the cross sections in the same plane.

In the resonance device 1, the supporting portion 140 of the resonator 10 is bonded onto the side wall 23 of the lower lid 20, and the supporting portion 140 of the resonator 10 is further bonded to the side wall 33 of the upper lid 30. In this manner, the resonator 10 is held between the lower lid 20 and the upper lid 30, and the vibration space in which the vibration portion 110 is vibrated is formed by the lower lid 20, the upper lid 30, and the supporting portion 140 of the resonator 10. Each of the resonator 10, the lower lid 20, and the upper lid 30 is formed by using a silicon (Si) substrate (hereafter referred to as a "Si substrate"), as an example. Alternatively, each of the resonator 10, the lower lid 20, and the upper lid 30 may be formed by using an SOI (Silicon on Insulator) substrate in which a silicon layer and a silicon oxide film are stacked. Alternatively, each of the resonator 10, the lower lid 20, and the upper lid 30 may be formed by using a substrate other than the Si substrate, for example, a compound semiconductor substrate, a glass substrate, a ceramic substrate, a resin substrate, or the like, provided that the substrate can be machined by using a micromachining technology.

Next, the configuration of the resonator 10 will be described.

The vibration portion 110, the supporting portion 140, and the supporting arm 150 of the resonator 10 are integrally formed by a single process. In the resonator 10, a metal film E1 is stacked on a Si substrate F2 which is an example of the substrate. A piezoelectric film F3 is stacked on the metal film E1 so as to cover the metal film E1, and a metal film E2 is further stacked on the piezoelectric film F3. A protective film F5 is stacked on the metal film E2 so as to cover the metal film E2. In the mass-loaded portions 122A to 122D, the above-described mass-loading films 125A to 125D, respectively, are further stacked on the protective film F5. The external shape of each of the vibration portion 110, the supporting portion 140, and the supporting arm 150 is formed by subjecting a multilayer body composed of the Si substrate F2, the metal film E1, the piezoelectric film F3, the metal film E2, the protective film F5, and the like to removal machining by dry etching through argon (Ar) ion beam irradiation and to patterning, for example.

The Si substrate F2 is formed of, for example, a degenerate n-type silicon (Si) semiconductor having a thickness of about 6 μm and may contain phosphorus (P), arsenic (As), antimony (Sb), or the like as an n-type dopant. The resistance value of the degenerate silicon (Si) used for the Si substrate F2 is, for example, less than 16 mΩ·cm and more preferably 1.2 mΩ·cm or less. Further, a temperature characteristic correction layer F21 composed of, for example, a silicon oxide such as $SiO_2$ is formed on the lower surface of the Si substrate F2.

The temperature characteristic correction layer F21 is a layer having a function of reducing the temperature coefficient of the resonant frequency of the resonator 10, that is, the rate of change in the resonant frequency per unit temperature, at least in the normal temperature vicinity. The vibration portion 110 including the temperature characteristic correction layer F21 improves the temperature characteristics of the resonator 10. In this regard, the temperature characteristic correction layer may be disposed on the upper surface of the Si substrate F2 or be disposed on both the upper surface and the lower surface of the Si substrate F2.

It is desirable that the temperature characteristic correction layer F21 of the mass-loaded portions 122A to 122D be formed having a uniform thickness. In this regard, the uniform thickness denotes variations in the thickness of the temperature characteristic correction layer F21 being within ±20% of the average value of the thickness.

Each of the metal films E1 and E2 includes an excitation electrode for exciting the vibration arms 121A to 121D and an extended electrode for electrically coupling the excitation electrode to an external power supply. The portions functioning as the excitation electrodes of the metal films E1 and E2 are opposite each other with the piezoelectric film F3 interposed therebetween in the arm portions 123A to 123D of the vibration arms 121A to 121D. The portions functioning as the extended electrodes of the metal films E1 and E2 extend, for example, from the base portion 130 to the supporting portion 140 through the supporting arm 150. The metal film E1 is electrically continuous with respect to the entire resonator 10. Regarding the metal film E2, the portions formed in the outer vibration arms 121A and 121D are electrically separated from the portions formed in the inner vibration arms 121B and 121C. The metal film E1 corresponds to a lower electrode, and the metal film E2 corresponds to an upper electrode.

The thickness of each of the metal films E1 and E2 is, for example, about 0.1 μm to 0.2 μm. The metal films E1 and E2 after film formation are patterned into the excitation electrode, the extended electrode, or the like through removal machining such as etching. The metal films E1 and E2 are formed of, for example, a metal material having a crystal structure being a body-centered cubic structure. Specifically, the metal films E1 and E2 are formed by using molybdenum (Mo), tungsten (W), or the like. In this regard, when the Si substrate F2 is a degenerate semiconductor substrate having high conductivity, the metal film E1 may be skipped, and the Si substrate F2 may also serves as the lower electrode.

The piezoelectric film F3 is a thin film formed from a type of piezoelectric material which performs conversion between electric energy and mechanical energy. The piezoelectric film F3 expands and contracts in the Y-axis direction of in-plane directions of the XY plane in accordance with an electric field applied to the piezoelectric film F3 by the metal films E1 and E2. An open end of each of the vibration arms 121A to 121D undergoes displacement toward a bottom plate 22 of the lower lid 20 and the bottom plate 32 of the upper lid 30 due to the expansion and contraction of the piezoelectric film F3. Therefore, the resonator 10 vibrates in the out-of-plane bending vibration mode.

The piezoelectric film F3 is formed of a material having a crystal structure being a wurtzite-type hexagonal system structure, and the primary component may be, for example, a nitride or an oxide, such as aluminum nitride (AlN), scandium aluminum nitride (ScAlN), zinc oxide (ZnO), gallium nitride (GaN), or indium nitride (InN). In this regard, scandium aluminum nitride is produced by substituting a portion of aluminum in aluminum nitride with scandium, and substitution may be performed with two elements, such as magnesium (Mg) and niobium (Nb) or magnesium (Mg) and zirconium (Zr), instead of scandium. The thickness of the piezoelectric film F3 is, for example, about 1 μm but may be about 0.2 μm to 2 μm.

The protective film F5 protects the metal film E2 from oxidation. In this regard, the protective film F5 is not limited to being exposed to the bottom plate 32 of the upper lid 30 provided that the protective film F5 is disposed on the upper lid 30 side. For example, a film, such as a stray-capacity-reducing film to reduce the capacity of a wiring line disposed in the resonator 10, that covers the protective film F5 may be disposed. The protective film F5 is formed of, for example, a nitride film of aluminum nitride (AlN), silicon nitride ($SiN_x$), or the like or an oxide film of aluminum oxide ($Al_2O_3$), tantalum pentoxide ($Ta_2O_5$), silicon oxide ($SiG_x$), or the like.

The mass-loading films 125A to 125D constitute the surfaces on the upper lid 30 side of the mass-loaded portions 122A to 122D, respectively, and correspond to frequency-adjusting films of the vibration arms 121A to 121D, respectively. The frequency of the resonator 10 is adjusted by trimming treatment which removes a portion of each of the mass-loading films 125A to 125D. From the viewpoint of efficiency of frequency adjustment, it is desirable that the mass-loading films 125A to 125D be formed of a material having a larger mass reduction rate due to etching than the protective film F5. The mass reduction rate is expressed as a product of an etching rate multiplied by a density. The etching rate is a thickness removed per unit time. There is no particular limitation regarding the relative etching rate between the protective film F5 and the mass-loading films 125A to 125D provided that the relationship in the mass reduction rate is as described above. In addition, from the viewpoint of efficiently increasing the weight of the mass-loaded portions 122A to 122D, it is preferable that the mass-loading films 125A to 125D be formed of a material having a large specific gravity. For these reasons, the mass-loading films 125A to 125D are formed of a metal material, for example, molybdenum (Mo), tungsten (W), gold (Au), platinum (Pt), nickel (Ni), and titanium (Ti). In this regard, in the trimming treatment, a portion of the protective film F5 may also be removed. In such an instance, the protective film F5 also corresponds to the frequency adjusting film.

A portion of the upper surface of each of the mass-loading films 125A to 125D is removed by the trimming treatment in a step of adjusting the frequency. The trimming treatment of the mass-loading films 125A to 125D is, for example, dry etching in which argon (Ar) ion beams are applied. The ion beams can be applied to a wide range, thereby having an excellent machining efficiency, but have electric charges, and there is a concern that the mass-loading films 125A to 125D may be charged. To prevent vibration orbitals of the vibration arms 121A to 121D from changing due to Coulomb interactions caused by the mass-loading films 125A to 125D being charged and to prevent the vibration characteristics of the resonator 10 from deteriorating, it is desirable that the mass-loading films 125A to 125D be grounded.

In the configuration example illustrated in FIG. 5, the mass-loading film 125A is electrically coupled to the metal film E1 by a through electrode passing through the piezoelectric film F3 and the protective film F5. The mass-loading films 125B to 125D, which are omitted from FIG. 5, are also electrically coupled to the metal film E1 by through electrodes. In this regard, the method for grounding each of the mass-loading films 125A to 125D is not limited to the above. For example, electrical coupling to the metal film E1 may be performed by a side surface electrode disposed on the side surface of the mass-loaded portions 122A to 122D. In this regard, the mass-loading films 125A to 125D are not limited to being electrically coupled to the metal film E1 and may be electrically coupled to, for example, the metal film E2, provided that the influence of the mass-loading films 125A to 125D being charged can be reduced.

Extended wires C1, C2, and C3 are disposed on the protective film F5 of the supporting portion 140. The extended wire C1 is electrically coupled to the metal film E1 through the through hole formed in the piezoelectric film F3 and the protective film F5. The extended wire C2 is electrically coupled to portions of the metal film E2 disposed in the outer vibration arms 121A and 121D through the through holes formed in the protective film F5. The extended wire C3 is electrically coupled to portions of the metal film E2 disposed in the inner vibration arms 121B and 121C through the through holes formed in the protective film F5. The extended wires C1 to C3 are formed of a metal material, such as aluminum (Al), germanium (Ge), gold (Au), or tin (Sn).

Next, the configuration of the lower lid 20 will be described.

The bottom plate 22 and the side wall 23 of the lower lid 20 are integrally formed from the Si substrate P10. The Si substrate P10 is formed of non-degenerate silicon, and the resistivity is, for example, 10 Ω·cm or more. The Si substrate P10 is exposed at the inner wall 25 of the recessed portion 21 of the lower lid 20. The temperature characteristic correction layer F21 is disposed on the upper surface of the protrusion portion 50. However, from the viewpoint of suppressing the protrusion portion 50 from being charged, the Si substrate P10 having a lower electric resistivity than the temperature characteristic correction layer F21 may be exposed at the upper surface of the protrusion portion 50, or a conductive layer may be disposed. The lower lid 20 corresponds to one of the pair of substrates.

The thickness of the lower lid 20 specified in the Z-axis direction is about 150 μm, and the depth D1 of the recessed portion 21 specified in the same manner is about 100 μm. Since the amplitude of each of the vibration arms 121A to 121D is limited to the depth D1, the maximum amplitude on the lower lid 20 side is about 100 μm.

In this regard, the lower lid 20 can also be assumed to be a portion of an SOI substrate. When the resonator 10 and the lower lid 20 are assumed to be a MEMS substrate formed from an integrated SOI substrate, the Si substrate P10 of the lower lid 20 corresponds to a support substrate of the SOI substrate, the temperature characteristic correction layer F21 of the resonator 10 corresponds to a BOX layer of the SOI substrate, and the Si substrate F2 of the resonator 10 corresponds to an active layer of the SOI substrate. In such an instance, outside the resonance device 1, various semiconductor elements, circuits, and the like may be formed by using a portion of the continuous MEMS substrate.

Next, the structure of the upper lid 30 will be described.

The bottom plate 32 and the side wall 33 of the upper lid 30 are integrally formed from the Si substrate Q10. It is preferable that the surface, the back surface, and the inner surface of the through hole of the upper lid 30 be covered with a silicon oxide film Q11. The silicon oxide film Q11 is formed on the surface of the Si substrate Q10 by, for example, oxidation of the Si substrate Q10 or chemical vapor deposition (CVD). The Si substrate Q10 is exposed at the inner wall 35 of the recessed portion 31 of the upper lid 30. The upper lid 30 corresponds to one of the pair of substrates, and the substrate Q10 corresponds to a silicon layer.

The thickness of the upper lid 30 specified in the Z-axis direction is about 150 μm, and the depth D2 of the recessed portion 31 specified in the same manner is about 100 μm. Since the amplitude of each of the vibration arms 121A to 121D is limited to the depth D2, the maximum amplitude on the upper lid 30 side is about 100 μm.

A diffusion-inhibiting layer 71 and an adsorption layer 72 are disposed in the recessed portion 31 of the upper lid 30.

The diffusion-inhibiting layer 71 is disposed on the inner wall 35 of the bottom plate 32 and is located between the Si substrate Q10 and the adsorption layer 72. Hydrogen is more difficult to diffuse in the diffusion-inhibiting layer 71 compared with in the Si substrate Q10, and hydrogen is more difficult to diffuse in the diffusion-inhibiting layer 71 compared with in the adsorption layer 72. The diffusion-inhibiting layer 71 suppresses hydrogen contained in the substrate Q10 from diffusing into the adsorption layer 72 so as to reduce the amount of hydrogen stored in the adsorption layer 72. The diffusion-inhibiting layer 71 contains, for example, a titanium silicon (Ti—Si) alloy. The diffusion-inhibiting layer 71 containing the titanium silicon alloy as a primary component may contain a silicon oxide and a titanium oxide. In the example illustrated in FIG. 4 and FIG. 5, the diffusion-inhibiting layer 71 is disposed on a portion of the inner wall 35 but may be disposed on the entire inner wall 35. The diffusion-inhibiting layer 71 is, for example, a metal layer but may be a semiconductor layer or an insulator layer. The diffusion-inhibiting layer 71 may have a stacking structure.

The adsorption layer 72 is disposed on the diffusion-inhibiting layer 71 on the bottom plate 32 and is located in a vibration space. The adsorption layer 72 adsorbs hydrogen and stores the adsorbed hydrogen through diffusion into the interior. Therefore, the adsorption layer 72 having room for the amount of hydrogen stored reduces the hydrogen partial pressure in the vibration space and increases the degree of vacuum of the vibration space. The adsorption layer 72 contains, for example, titanium (Ti). In the example illustrated in FIG. 4 and FIG. 5, in the plan view of the inner wall 35 of the bottom plate 32, the end portion of the adsorption layer 72 is substantially in accord with the end portion of the diffusion-inhibiting layer 71. The end portion of the adsorption layer 72 is not limited to the above, provided that the end portion is on the diffusion-inhibiting layer 71, and may be located inside the end portion of the diffusion-inhibiting layer 71. In this regard, the material constituting the adsorption layer 72 is not limited to titanium provided that hydrogen can be occluded, and zirconium (Zr), vanadium (V), niobium (Nb), tantalum (Ta), an alloy containing at least one of these, an alkali metal oxide, or an alkaline-earth metal oxide may be contained. The adsorption layer 72 may contain a material that adsorbs oxygen, water vapor, and the like other than hydrogen. Adsorption and desorption of hydrogen in the adsorption layer 72 is an equilibrium reaction, and the hydrogen partial pressure in the vibration space is proportional to the amount of hydrogen stored in the adsorption layer 72.

Terminals T1, T2, and T3 are disposed on the upper surface (a surface opposite to a surface opposing the resonator 10) of the upper lid 30. The terminal T1 is a mounting terminal to ground the metal film E1. The terminal T2 is a mounting terminal to electrically couple the metal film E2 of the outer vibration arms 121A and 121D to an external power supply. The terminal T3 is a mounting terminal to electrically couple the metal film E2 of the inner vibration arms 121B and 121C to the external power supply. The terminals T1 to T3 are formed by, for example, applying plating of nickel (Ni), gold (Au), silver (Ag), copper (Cu), or the like to a metallizing layer (underlying layer) of chromium (Cr), tungsten (W), nickel (Ni), or the like. In addition, to adjust a stray capacity and a mechanical strength balance, a dummy terminal electrically insulated from the resonator 10 may be disposed on the upper surface of the upper lid 30.

The through electrodes V1, V2, and V3 are disposed inside the side wall 33 of the upper lid 30. The through electrode V1 electrically couples the terminal T1 to the extended wire C1, the through electrode V2 electrically couples the terminal T2 to the extended wire C2, and the through electrode V3 electrically couples the terminal T3 to the extended wire C3. The through electrodes V1 to V3 are formed by filling the through holes that pass through the side wall 33 of the upper lid 30 in the Z-axis direction with a conductive material. The conductive material introduced is, for example, polycrystalline silicon (Poly-Si), copper (Cu), gold (Au), or the like.

To bond the side wall 33 of the upper lid 30 to the supporting portion 140 of the resonator 10, a bonding portion H is disposed between the side wall 33 of the upper lid 30 and the supporting portion 140. The bonding portion H is formed into the shape of a closed circle surrounding the vibration portion 110 in the XY plane so as to hermetically seal the vibration space of the resonator 10 in a vacuum state. The bonding portion H is formed of, for example, a metal film in which an aluminum (Al) film, a germanium (Ge) film, and an aluminum (Al) film are stacked in this order and are eutectic bonded. In this regard, the bonding portion H may include a film appropriately selected from, for example, gold (Au), tin (Sn), copper (Cu), titanium (Ti), aluminum (Al), germanium (Ge), and silicon (Si) and an alloy containing at least one of these. The bonding portion H may contain a eutectic metal containing at least one of aluminum, copper, silicon, germanium, and titanium. In addition, to improve adhesiveness, the bonding portion H may include an insulator film composed of a metal compound such as titanium nitride (TiN) or tantalum nitride (TaN).

Next, the operation of the resonance device 1 will be described with reference to FIG. 4 and FIG. 5.

In the present embodiment, the terminal T1 is grounded and alternating voltages which have phases opposite to each other are applied to the terminals T2 and T3. Therefore, the phase of an electric field formed for the piezoelectric films F3 of the outer vibration arms 121A and 121D and the phase of an electric field formed for the piezoelectric films F3 of the inner vibration arms 121B and 121C are phases opposite to each other. Consequently, the outer vibration arms 121A and 121D and the inner vibration arms 121B and 121C vibrate in the phases opposite to each other. For example, when the mass-loaded portions 122A and 122D of the outer vibration arms 121A and 121D, respectively, are displaced toward the inner wall 35 of the upper lid 30, the mass-loaded portions 122B and 122C of the inner vibration arms 121B and 121C, respectively, are displaced toward the inner wall 25 of the lower lid 20. As described above, the vibration arm 121A and the vibration arm 121B vibrate in the vertical directions opposite to each other while a center axis r1 extends in the Y-axis direction between the vibration arm 121A and the vibration arm 121B adjacent to each other. In addition, the vibration arm 121C and the vibration arm 121D vibrate in the vertical directions opposite to each other while a center axis r2 extends in the Y-axis direction between the vibration arm 121C and the vibration arm 121D adjacent to each other. Consequently, the torsional moments in the directions opposite to each other are generated in the center axes r1 and r2, and bending vibration occurs in the base portion 130. The maximum amplitude of the vibration arms 121A to 121D is about 100 μm, and the amplitude during a normal operation is about 10 μm.

Figure 6:
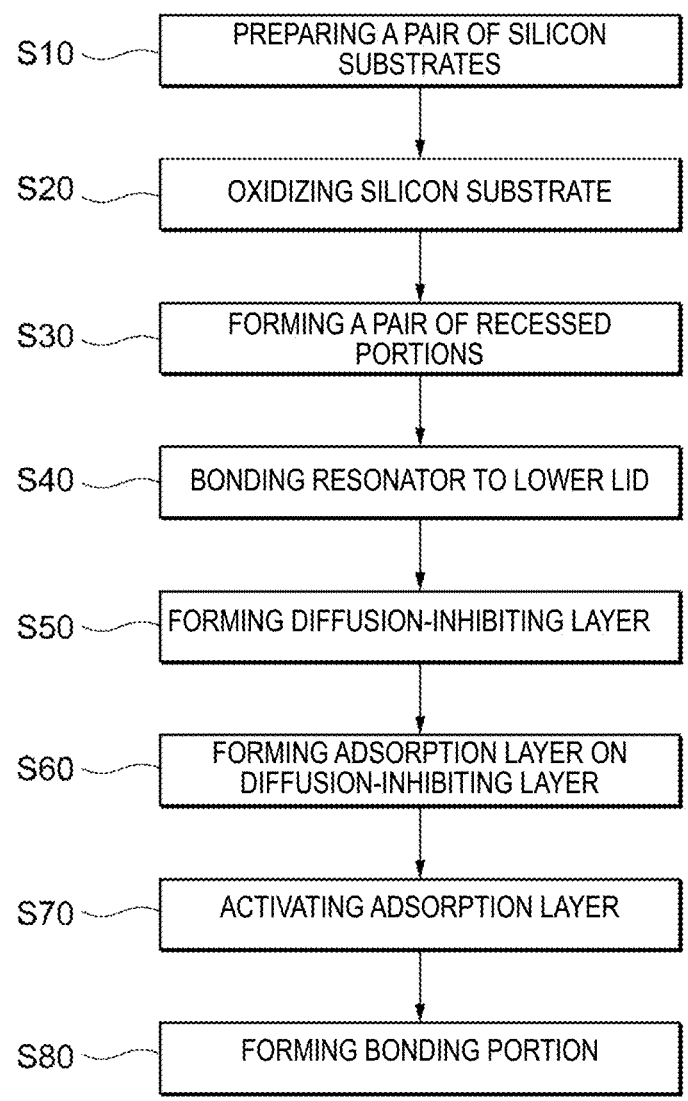
FIG. 6 is a flow chart schematically illustrating a method for manufacturing the resonance device according to the first embodiment.
Figure 7:
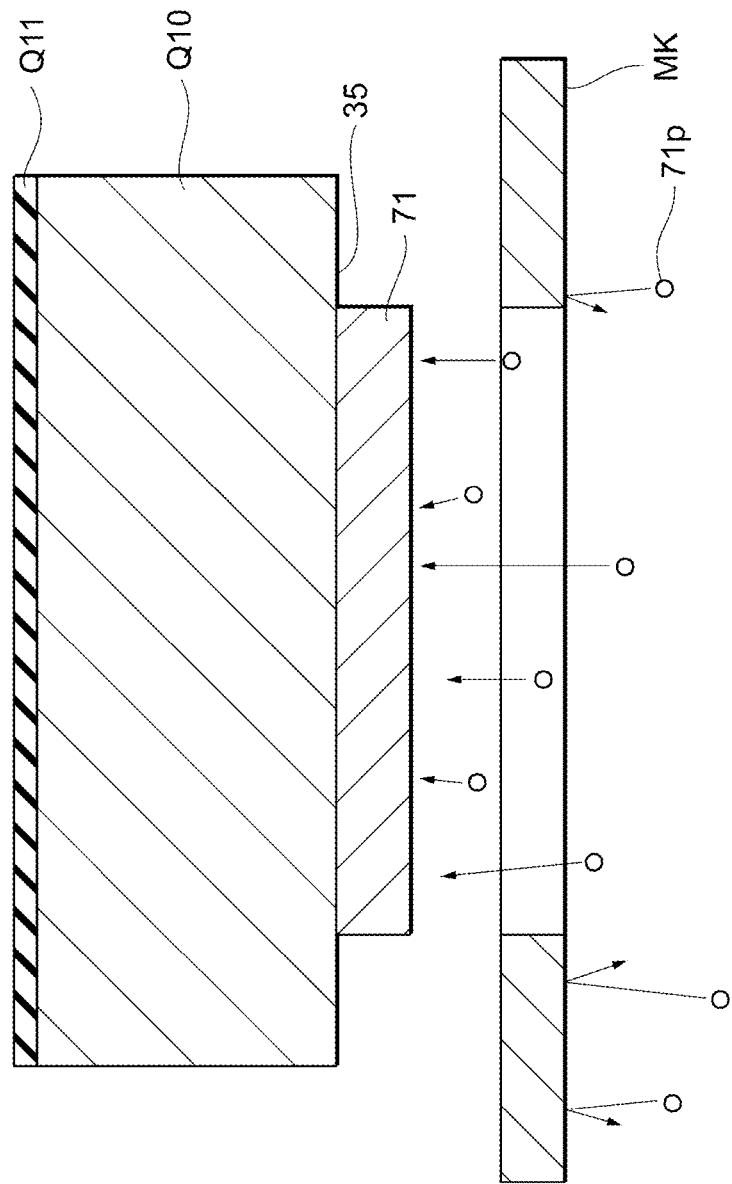
FIG. 7 is a schematic sectional view illustrating a step of forming a diffusion-inhibiting layer.
Figure 8:
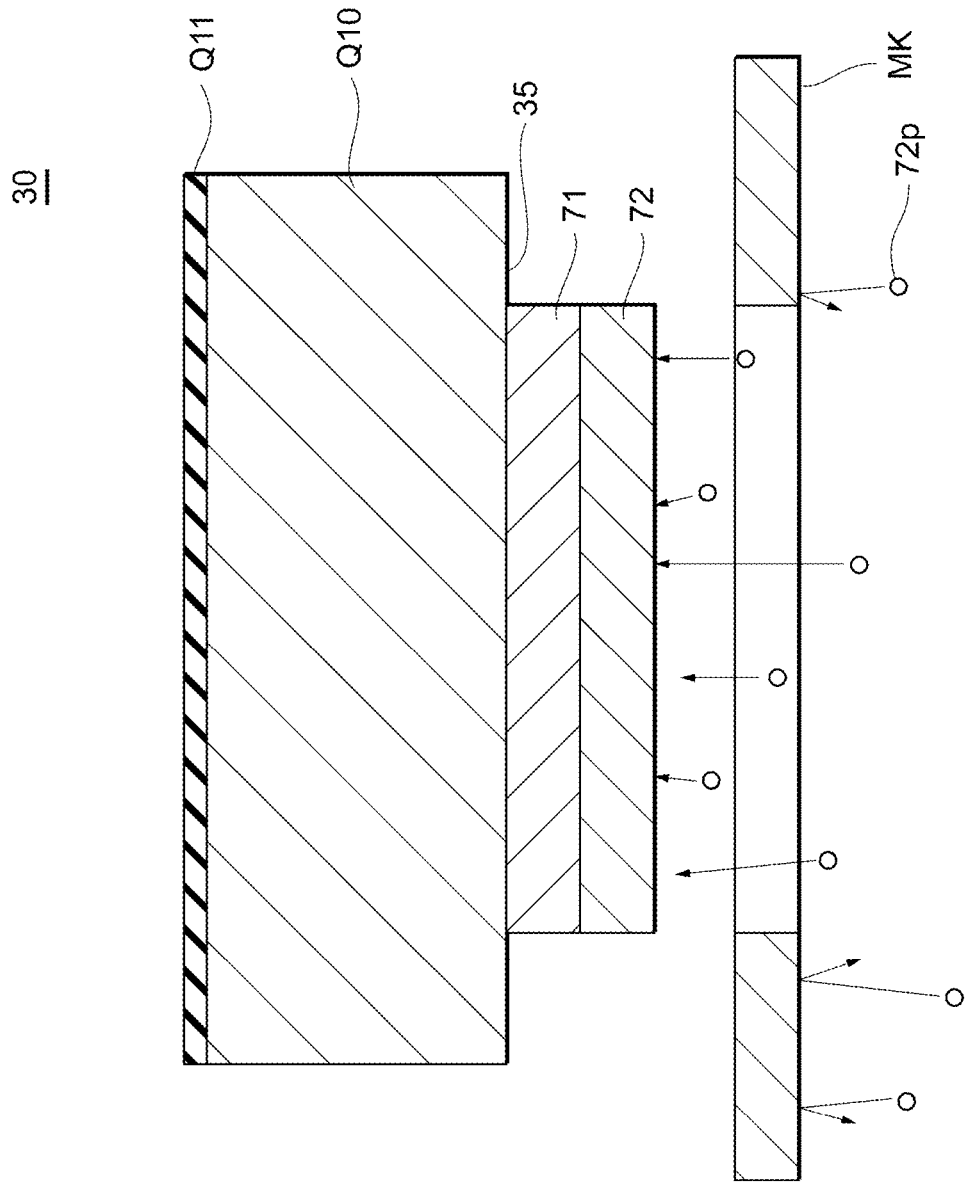
FIG. 8 is a schematic sectional view illustrating a step of forming an adsorption layer.

Next, a method for manufacturing the resonance device 1 according to the first embodiment will be described with reference to FIG. 6 to FIG. 8. FIG. 6 is a flow chart schematically illustrating a method for manufacturing the resonance device according to the first embodiment. FIG. 7 is a schematic sectional view illustrating a step of forming the diffusion-inhibiting layer. FIG. 8 is a schematic sectional view illustrating a step of forming the adsorption layer.

A pair of silicon substrates are prepared (S10). The pair of silicon substrates correspond to the Si substrates P10 and Q10.

The silicon substrates are oxidized (S20). Consequently, the silicon oxide film Q11 is formed on the surface of the Si substrate Q10, and the temperature characteristic correction layer F21 is formed on the surface of the Si substrate P10. In this regard, only the silicon oxide film Q11 may be formed in the present step, and the temperature characteristic correction layer F21 may be formed in a separate step.

A pair of recessed portions are formed (S30). A portion of the upper surface of the Si substrate P10 is subjected to removal machining by an etching method so as to form the recessed portion 21 surrounded by the inner wall 25. In addition, a portion of the upper surface of the Si substrate Q10 is subjected to removal machining by an etching method so as to form the recessed portion 31 surrounded by the inner wall 35. The method for forming the recessed portions 21 and 31 is not limited to the etching method. The recessed portion 21 may be formed after the resonator 10 is bonded to the lower lid 20.

The resonator is bonded to the lower lid (S40). The lower lid 20 and the resonator 10 are heated to a melting point or less, and the side wall 23 of the lower lid 20 is pressure-bonded to the supporting portion 140 of the resonator 10. The method for bonding the lower lid 20 to the resonator 10 is not limited to the above-described thermocompression bonding, and bonding may be performed by using, for example, an adhesive, a brazing material, solder, or the like.

The diffusion-inhibiting layer is formed (S50). As illustrated in FIG. 7, particles 71p are deposited on the inner wall 35 of the upper lid 30 so as to form a film of the diffusion-inhibiting layer 71 on the Si substrate Q10. The particles 71p are, for example, vapor of a titanium silicon alloy or a mixture of titanium vapor and silicon vapor. The diffusion-inhibiting layer 71 is formed through pattern film formation by using a metal mask MK.

An adsorption layer is formed (S60). As illustrated in FIG. 8, particles 72p are deposited on the diffusion-inhibiting layer 71 so as to form a film of the adsorption layer 72. The particles 72p are, for example, titanium vapor. The adsorption layer 72 is formed through pattern film formation by using the same metal mask MK as that used for pattern film formation of the diffusion-inhibiting layer 71. In this regard, when the diffusion-inhibiting layer 71 and the adsorption layer 72 are formed by patterning, the patterning method is not limited to pattern film formation, and an etching method by using a photoresist or a lift off method may be adopted.

The adsorption layer is activated (S70). The adsorption layer 72 is heated, thereby desorbing hydrogen adsorbed on the surface of the adsorption layer 72 and recovering a hydrogen adsorption effect of the adsorption layer 72. The activation of the adsorption layer 72 is realized by heat treatment. Such heat treatment is performed, for example, at a heating temperature of 350° C. to 500° C. for a heating time of 5 min to 30 min. This is because the adsorption layer 72 cannot be sufficiently activated by heating at a temperature lower than 350° C. and for a time less than 5 min. In addition, this is because heating at a temperature higher than 500° C. and for a time more than 30 min deteriorates the energy efficiency for activation and increases a production lead time.

The bonding portion is formed (S80). The metallizing layer of the lower lid 20 is metal-bonded to the metallizing layer of the upper lid 30 in an environment of reduced pressure. The bonding portion H formed in such an instance hermetically seals the vibration space in a vacuum state. The bonding portion H is formed by heat treatment. Such heat treatment is performed, for example, at a heating temperature of 400° C. to 500° C. for a heating time of 1 min to 30 min. This is because sufficient bonding strength and sealing performance is not obtained by heating at a temperature lower than 400° C. and for a time less than 1 min. In addition, this is because heating at a temperature higher than 500° C. and for a time more than 30 min deteriorates the energy efficiency for bonding and increases a production lead time.

As described above, in the present embodiment, the diffusion-inhibiting layer 71 in which hydrogen is more difficult to diffuse compared with in the Si substrate Q10 is disposed between the Si substrate Q10 of the upper lid 30 and the adsorption layer 72.

Accordingly, since hydrogen is suppressed from diffusing from the Si substrate Q10 to the adsorption layer 72, the amount of hydrogen stored in the adsorption layer 72 can be reduced. The amount of hydrogen stored in the adsorption layer 72 being reduced enables hydrogen to be suppressed from desorbing from the adsorption layer 72. Therefore, the initial amount of hydrogen adsorbed by the adsorption layer 72 being reduced enables the hydrogen adsorption capability of the adsorption layer 72 to be suppressed from deteriorating over time and enables to high degree of vacuum to be maintained. In addition, the hydrogen partial pressure in the vibration space can be reduced, and an initial degree of vacuum can be increased. Such a package structure being applied to the resonance device 1 enables a change over time of the frequency and initial frequency deviation to be reduced.

In the diffusion-inhibiting layer 71, hydrogen is more difficult to diffuse compared with in the adsorption layer 72.

Accordingly, since hydrogen is further suppressed from diffusing from the Si substrate Q10 to the adsorption layer 72, the degree of vacuum can be suppressed from deteriorating over time, and the initial degree of vacuum in the vibration space is increased.

The diffusion-inhibiting layer 71 contains a titanium silicon alloy and may contain a titanium oxide.

Regarding the titanium silicon alloy, the energy required for diffusion of hydrogen is high compared with silicon, and hydrogen can be sufficiently suppressed from diffusing.

The adsorption layer 72 contains titanium. The upper lid 30 includes a silicon layer.

Accordingly, an alloy of the silicon layer of the upper lid 30 and titanium of the adsorption layer 72 can be formed by heat treatment.

In an example, the diffusion-inhibiting layer 71 is disposed on the inner wall 35 of the upper lid 30. The bonding portion H contains at least one of aluminum, copper, silicon, germanium, titanium, gold, and tin.

The frequency band of the resonator 10 is 1 kHz to 1 MHz.

Accordingly, regarding even a vibration element having a frequency band that is considerably influenced by the degree of vacuum in the vibration space, an initial frequency deviation and a change over time of the frequency can be reduced.

In this regard, in the first embodiment, the diffusion-inhibiting layer 71 and the adsorption layer 72 are disposed on a portion of the inner wall 35 of the upper lid 30, but the diffusion-inhibiting layer 71 and the adsorption layer 72 may be disposed on the entire inner wall 35. Alternatively, the diffusion-inhibiting layer 71 and the adsorption layer 72 may be disposed on a portion of or entire inner wall 25 of the lower lid 20 or may be disposed on both the lower lid 20 and the upper lid 30.

The configurations of the resonators according to other embodiments of the present invention will be described below. In the embodiments below, explanations about the matters common to the first embodiment will be omitted, and only different points will be described. In particular, similar operations and advantages due to similar configurations will not be specifically described.

Second Embodiment

Figure 9:
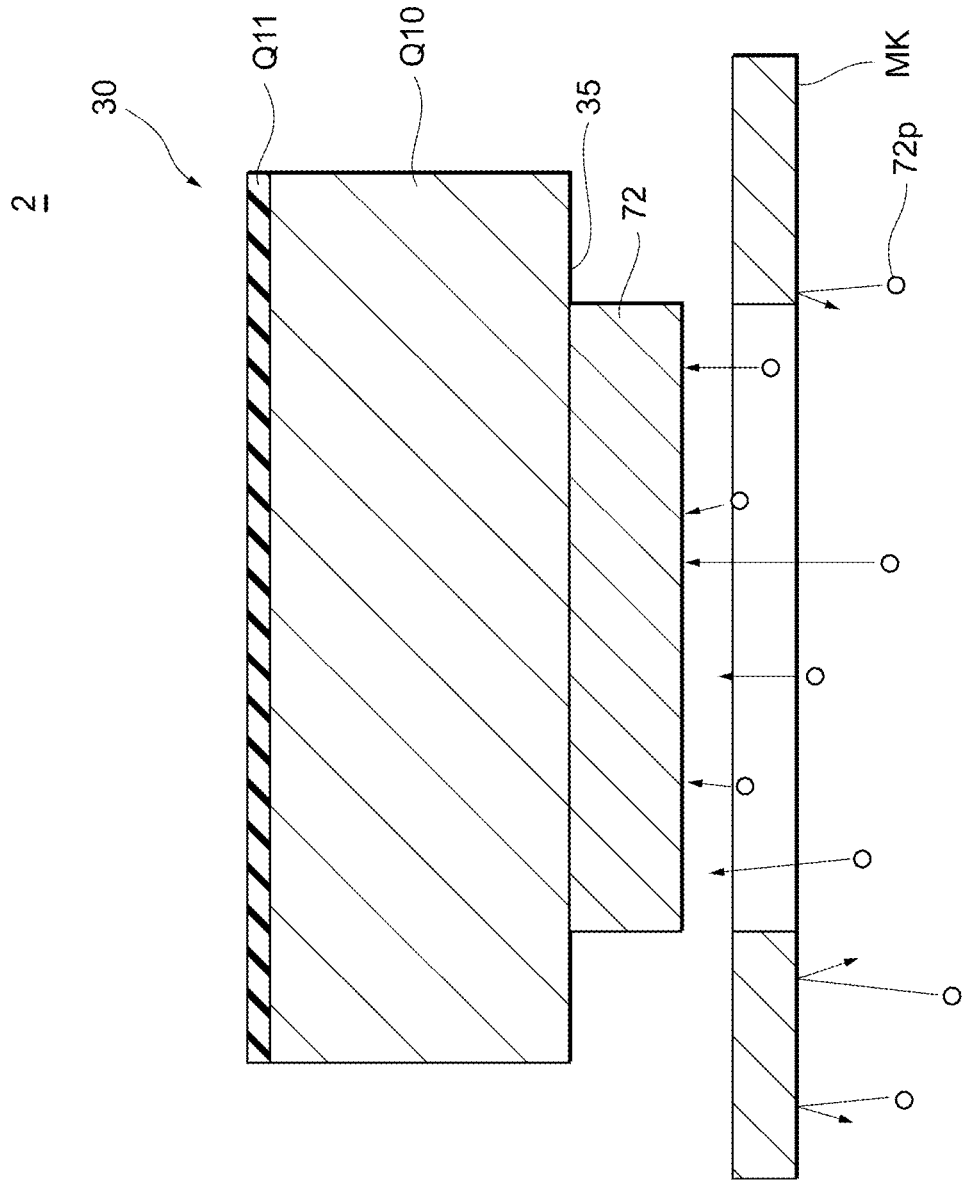
FIG. 9 is a schematic sectional view illustrating a step of forming an adsorption layer in a method for manufacturing a resonance device according to a second embodiment.
Figure 10:
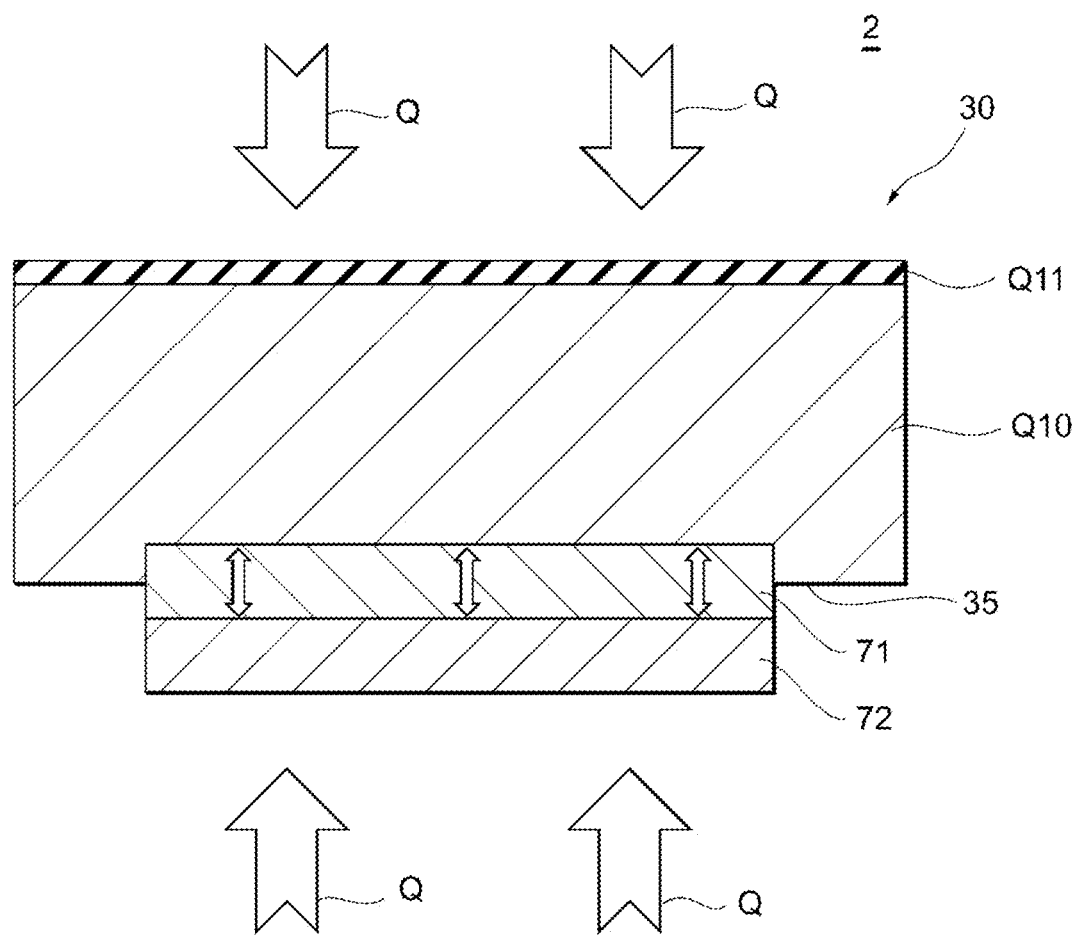
FIG. 10 is a schematic sectional view illustrating a step of forming a diffusion-inhibiting layer in the method for manufacturing a resonance device according to the second embodiment.

Next, a resonance device 2 according to a second embodiment and a method for manufacturing the same will be described with reference to FIGS. 9 and 10. FIG. 9 is a schematic sectional view illustrating a step of forming an adsorption layer in a method for manufacturing a resonance device according to the second embodiment. FIG. 10 is a schematic sectional view illustrating a step of forming a diffusion-inhibiting layer in the method for manufacturing a resonance device according to the second embodiment.

In the second embodiment, the diffusion-inhibiting layer 71 is formed after the adsorption layer 72 is formed. Specifically, as illustrated in FIG. 9, particles 72p are deposited on the inner wall 35 of the upper lid 30 so as to form the adsorption layer 72 on the Si substrate Q10 through pattern film formation. Subsequently, as illustrated in FIG. 10, the diffusion-inhibiting layer 71 is formed between the Si substrate Q10 and the adsorption layer 72 by heat treatment. The heat treatment is performed by, for example, providing an amount of heat Q to the upper lid 30 and the adsorption layer 72 in a vacuum or in an atmosphere of inert gas such as nitrogen by using an external heater so as not to oxidize the adsorption layer 72. In such an instance, at a boundary portion between the Si substrate Q10 and the adsorption layer 72, the diffusion-inhibiting layer 71 composed of a titanium silicon alloy is formed from silicon contained in the Si substrate Q10 and titanium contained in the adsorption layer 72 serving as the raw materials. Consequently, a portion of the diffusion-inhibiting layer 71 is within a surface of the Si substrate Q10 of the upper lid 30.

Accordingly, the adhesiveness between the upper lid 30 and the diffusion-inhibiting layer 71 and the adhesiveness between the diffusion-inhibiting layer 71 and the adsorption layer 72 are improved.

The heat treatment to provide the amount of heat Q can be performed in, for example, the step of activating the adsorption layer 72. In such an instance, the heating temperature is 450° C. to 700° C., and the heating time is 1 hour or more. When the step of activating the adsorption layer 72 also serves as the step of forming the diffusion-inhibiting layer 71 as described above, the heating time is long and the heating temperature is high compared with the step of just activating the adsorption layer, but it is thereby possible to activate the adsorption layer 72 and, in addition, to form the diffusion-inhibiting layer 71. Therefore, the production process can be simplified so as to reduce the production cost.

The heat treatment to provide the amount of heat Q can be performed in, for example, the step of forming the bonding portion H. In such an instance, the heating temperature is 450° C. to 700° C., and the heating time is 1 hour or more. When the step of forming the bonding portion H also serves as the step of forming the diffusion-inhibiting layer 71 as described above, the heating time is long compared with the step of just forming the bonding portion, but it is thereby possible to activate the adsorption layer 72 and, in addition, to form the diffusion-inhibiting layer 71. Therefore, the production process can be simplified so as to reduce the production cost.

In this regard, the heat treatment to provide the amount of heat Q may be performed separately from the step of activating the adsorption layer 72 and the step of forming the bonding portion H.

Accordingly, the piezoelectricity of the resonator 10 can be suppressed from changing due to the heat treatment. That is, the characteristics of the element housed in the package structure can be suppressed from changing.

Third Embodiment

Figure 11:
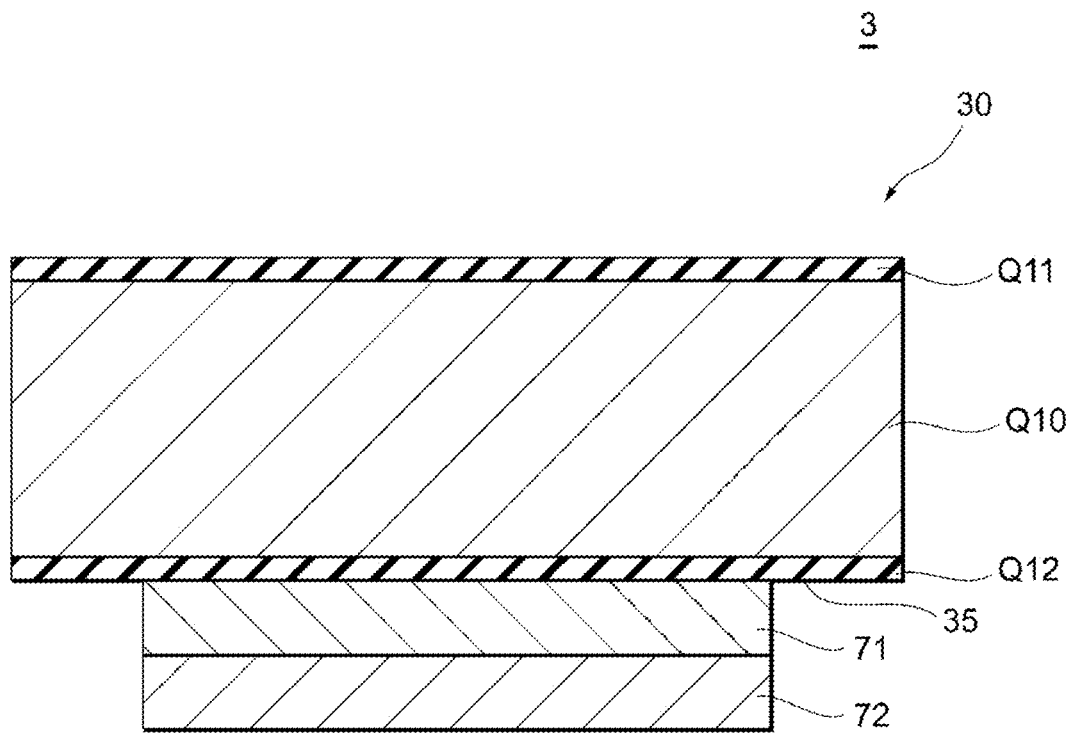
FIG. 11 is a schematic sectional view illustrating the structure of an upper lid according to a third embodiment.

Next, a resonance device 3 according to a third embodiment and a method for manufacturing the same will be described with reference to FIG. 11. FIG. 11 is a schematic sectional view illustrating the structure of an upper lid according to the third embodiment.

The third embodiment differs from the first embodiment in that a silicon oxide film Q12 corresponding to the silicon oxide layer is included. The silicon oxide film Q12 is disposed on a side of the Si substrate Q10 adjacent the adsorption layer 72, and the surface of the silicon oxide film Q12 corresponds to the inner wall 35.

In the third embodiment, the silicon oxide film Q12 is disposed in a region between the Si substrate Q10 and the diffusion-inhibiting layer 71 and in a region outside the above-described region. In other words, the diffusion-inhibiting layer 71 is disposed on a portion of the silicon oxide film Q12.

Fourth Embodiment

Figure 12:
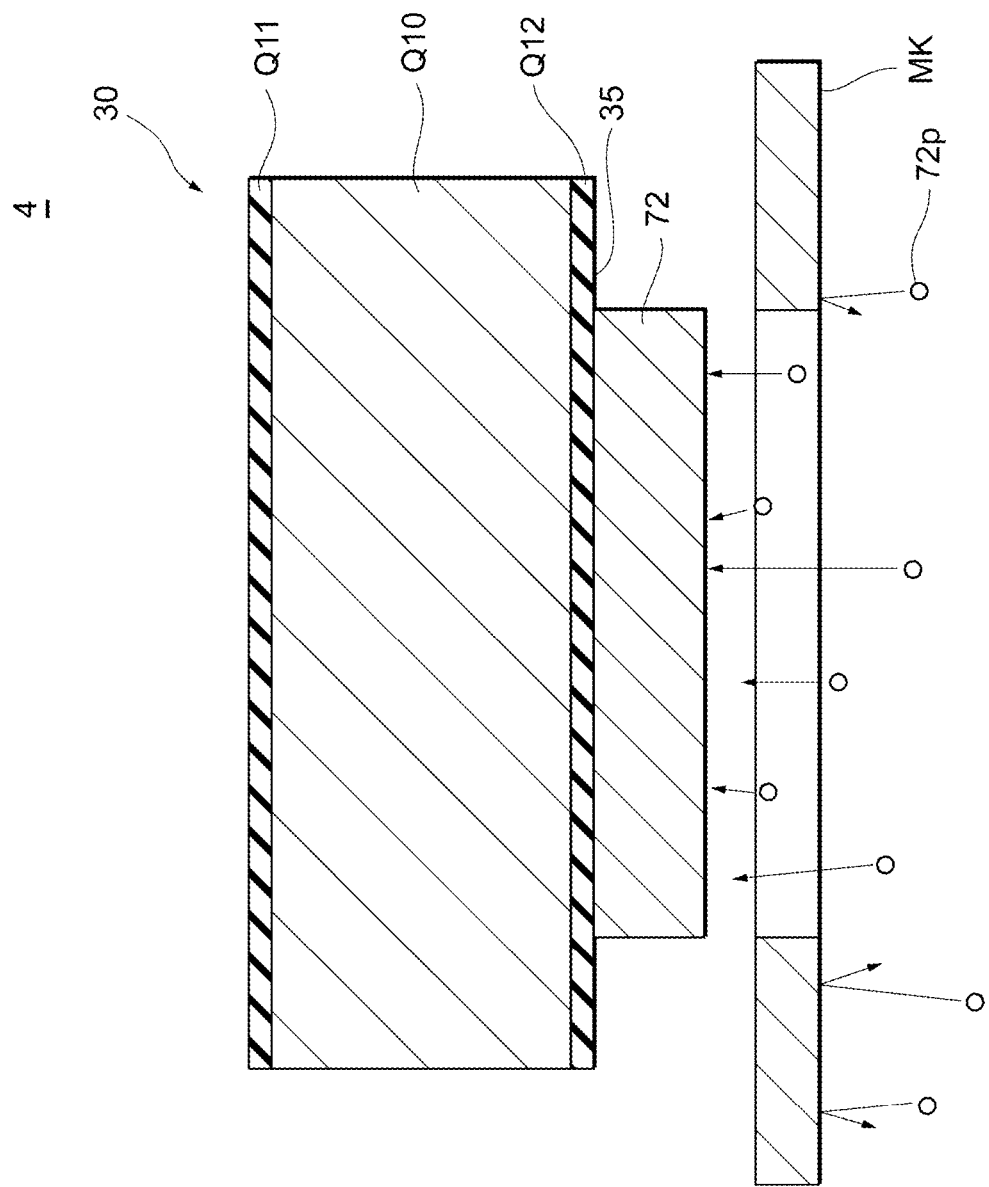
FIG. 12 is a schematic sectional view illustrating a step of forming an adsorption layer in a method for manufacturing a resonance device according to a fourth embodiment.
Figure 13:
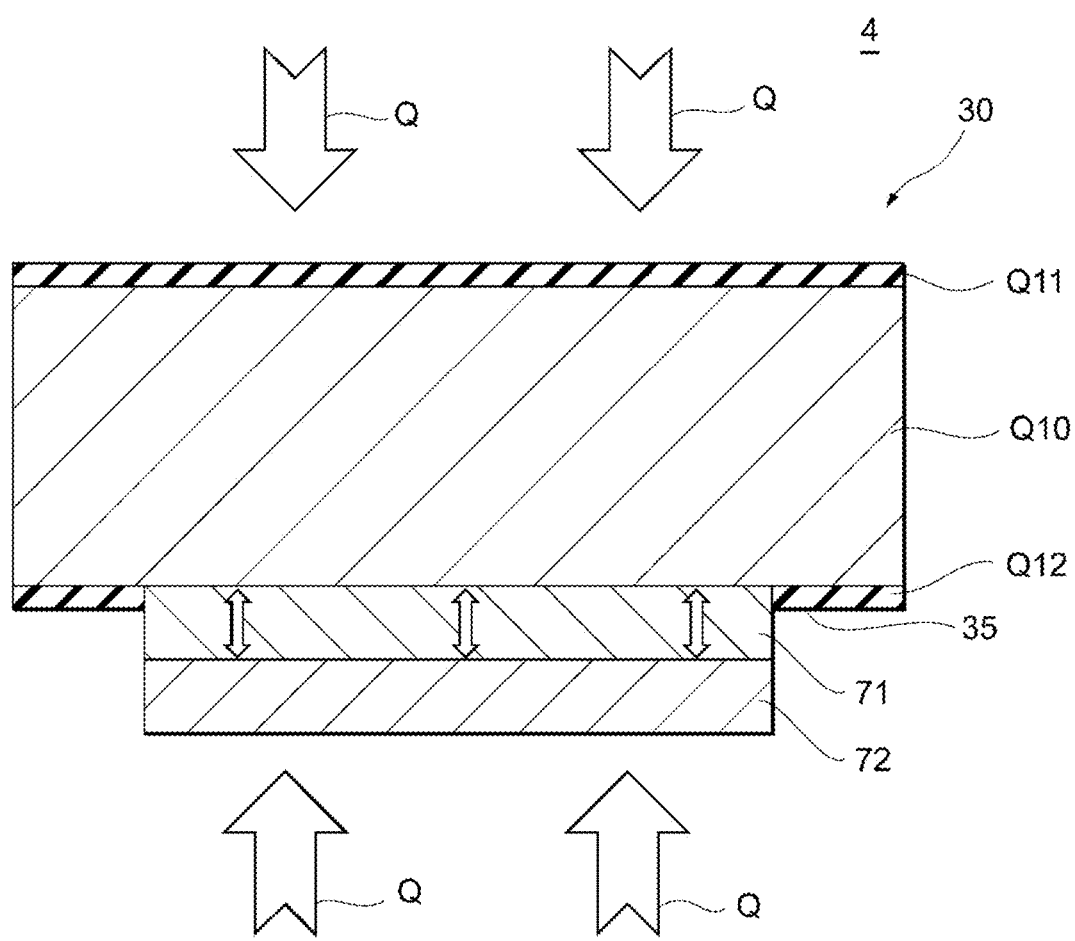
FIG. 13 is a schematic sectional view illustrating a step of forming a diffusion-inhibiting layer in the method for manufacturing a resonance device according to the fourth embodiment.

Next, a resonance device 4 according to a fourth embodiment and a method for manufacturing the same will be described with reference to FIG. 12 and FIG. 13. FIG. 12 is a schematic sectional view illustrating a step of forming an adsorption layer in a method for manufacturing a resonance device according to a fourth embodiment. FIG. 13 is a schematic sectional view illustrating a step of forming a diffusion-inhibiting layer in the method for manufacturing a resonance device according to the fourth embodiment.

In the fourth embodiment, before the diffusion-inhibiting layer 71 and the adsorption layer 72 are formed, the silicon oxide film Q12 is formed on the Si substrate Q10 so as to be opposite to the silicon oxide film Q11. The silicon oxide film Q12 is formed by, for example, oxygen plasma treatment of the Si substrate Q10. The thickness of the silicon oxide film Q12 is desirably small and is, for example, 5 nm or less. Thereafter, as illustrated in FIG. 12, particles 72p are deposited on the inner wall 35 composed of the silicon oxide film Q12 so as to form the adsorption layer 72 on the Si substrate Q10 through pattern film formation. Subsequently, as illustrated in FIG. 13, the diffusion-inhibiting layer 71 is formed between the Si substrate Q10 and the adsorption layer 72 by heat treatment. In such an instance, the diffusion-inhibiting layer 71 composed of a titanium silicon alloy and a titanium oxide is formed from silicon oxide of the silicon oxide film Q12 and titanium of the adsorption layer 72 serving as the raw materials. Since the silicon oxide film Q12 in a region in contact with the adsorption layer 72 is consumed for forming the titanium silicon alloy and the titanium oxide, the diffusion-inhibiting layer 71 adjoins the silicon oxide film Q12 in the direction parallel to the interface between the diffusion-inhibiting layer 71 and the adsorption layer 72.

The heat treatment to provide the amount of heat Q can be performed in the step of activating the adsorption layer 72 or the step of forming the bonding portion H as in the second embodiment. However, in the fourth embodiment, since the silicon oxide film Q12 is present, the heating temperature required for forming the titanium silicon alloy is lowered. In the fourth embodiment, the heating temperature for forming the diffusion-inhibiting layer 71 is 400° C. to 700° C., and the heating time is 1 hour or more. Therefore, the energy required for the production can be reduced compared with the second embodiment.

A portion of or entire embodiments according to the present invention will be additionally noted below, and the effects thereof will be explained. In this regard, the present invention is not limited to the additional notes below.

According to an aspect of the present invention, a pair of substrates arranged to oppose each other so as to form an internal space; a bonding portion sealing the pair of substrates; an element sealed in the internal space and surrounded by the pair of substrates; an adsorption layer within the internal space and opposing at least one substrate of the pair of substrates, the adsorption layer constructed to adsorbs at least hydrogen; and a diffusion-inhibiting layer which between the at least one substrate and the adsorption layer, and in which hydrogen is more difficult to diffuse compared with in the at least one substrate.

Accordingly, since hydrogen is suppressed from diffusing from the at least one substrate to the adsorption layer, the amount of hydrogen stored in the adsorption layer can be reduced. The amount of hydrogen stored in the adsorption layer being reduced enables hydrogen to be suppressed from desorbing from the adsorption layer. Therefore, the initial amount of hydrogen adsorbed by the adsorption layer being reduced enables the hydrogen adsorption capability of the adsorption layer to be suppressed from deteriorating over time and enables to high degree of vacuum to be maintained. In addition, the hydrogen partial pressure in the vibration space can be reduced, and an initial degree of vacuum can be increased. Such a package structure being applied to the resonance device enables a change over time of the frequency and initial frequency deviation to be reduced.

According to an aspect, hydrogen is more difficult to diffuse in the diffusion-inhibiting layer compared with in the adsorption layer.

Accordingly, since hydrogen is further suppressed from diffusing from the at least one substrate to the adsorption layer, the degree of vacuum can be suppressed from deteriorating over time, and the initial degree of vacuum in the vibration space is increased.

According to an aspect, the diffusion-inhibiting layer contains a titanium silicon alloy.

Regarding the titanium silicon alloy, the energy required for diffusion of hydrogen is high compared with silicon, and hydrogen can be sufficiently suppressed from diffusing.

According to an aspect, the diffusion-inhibiting layer contains titanium oxide.

According to an aspect, the adsorption layer contains titanium.

According to an aspect, the at least one substrate includes a silicon layer.

Accordingly, an alloy of the silicon layer of the at least one substrate and titanium of the adsorption layer can be formed by heat treatment.

According to an aspect, the at least one substrate further includes a silicon oxide layer on a side of the silicon layer adjacent the adsorption layer.

According to an aspect, the thickness of the silicon oxide layer is 5 nm or less.

According to an aspect, the diffusion-inhibiting layer is disposed on the surface of the at least one substrate.

According to an aspect, at least a portion of the diffusion-inhibiting layer is within a surface of the at least one substrate.

Accordingly, the adhesiveness between the at least one substrate and the diffusion-inhibiting layer and the adhesiveness between the diffusion-inhibiting layer and the adsorption layer are improved.

According to an aspect, the bonding portion contains at least one of aluminum, copper, silicon, germanium, titanium, gold, and tin.

According to an aspect, the element is a vibration element with a frequency band of 1 kHz to 1 MHz. Accordingly, regarding even a vibration element having a frequency band that is considerably influenced by the degree of vacuum in the vibration space, a change over time of the frequency and an initial frequency deviation can be reduced.

According to an aspect of the present invention, a method for manufacturing a package structure includes: forming an adsorption layer which adsorbs at least hydrogen on at least one substrate of a pair of substrates; forming, on the at least one substrate, a diffusion-inhibiting layer in which hydrogen is more difficult to diffuse compared with in the at least one substrate; arranging the pair of substrates such that the adsorption layer on the at least one substrate opposes the other substrate; and sealing an element in an internal space surrounded by the pair of substrates by forming a bonding portion between the pair of substrates.

Accordingly, a package structure capable of readily maintaining a high degree of vacuum can be provided.

According to an aspect, the adsorption layer is formed on the at least one substrate, and after the forming of the adsorption layer, the diffusion-inhibiting layer is derived from a material contained in the at least one substrate and a material contained in the adsorption layer by a heat treatment.

According to an aspect, the heat treatment is performed for at least 1 hour.

According to an aspect, the method further includes the step of activating the adsorption layer, wherein the heat treatment is performed in the activating of the adsorption layer.

Accordingly, it is possible to activate the adsorption layer and, in addition, to form the diffusion-inhibiting layer. Therefore, the production process can be simplified so as to reduce the production cost.

According to an aspect, the heat treatment is performed in the forming of the bonding portion.

Accordingly, it is possible to activate the adsorption layer and, in addition, to form the bonding portion. Therefore, the production process can be simplified so as to reduce the production cost.

According to an aspect, the at least one substrate includes a silicon layer, the forming of the adsorption layer includes forming titanium on the silicon layer, and the heat treatment is performed at 450° C. to 700° C.

According to an aspect, the at least one substrate includes a silicon layer and a silicon oxide layer formed on the silicon layer, the forming of the adsorption layer includes forming titanium on the silicon oxide layer, and the heat treatment is performed at 400° C. to 700° C.

When the silicon oxide layer is present, the heating temperature required for forming the titanium silicon alloy is lowered. Therefore, the energy required for the production can be reduced.

As described above, according to an aspect of the present invention, a package structure capable of readily maintaining a high degree of vacuum and a method for manufacturing the same can be provided.

In this regard, the embodiments described above are for the sake of facilitating understanding of the present invention and are not for restricting the interpretation of the present invention. The present invention is modified/improved without departing from the scope and spirit of the invention, and the present invention includes the equivalents thereof. That is, the embodiments to which those skilled in the art appropriately applied design changes are also included in the scope of the present invention provided that the features of the present invention are provided. For example, the elements and arrangements, materials, conditions, shapes, sizes, and the like thereof included in the embodiments are not limited to those described as examples and can be appropriately changed. For example, the vibration element and the vibrator according to the present invention can be used for timing devices or load sensors. In addition, the elements included in the embodiments can be combined when it is technically possible, and combinations thereof are also included in the scope of the present invention provided that the features of the present invention are provided.

REFERENCE SIGNS LIST 1 resonance device
10 resonator
20 lower lid
30 upper lid
Q10, P10 silicon (Si) substrate
21, 31 recessed portion
22, 32 bottom plate
23, 33 side wall
25, 35 inner wall
71 diffusion-inhibiting layer
72 adsorption layer

The invention claimed is:

1. A package structure comprising:
a pair of substrates arranged to oppose each other so as to form an internal space;
a bonding portion sealing the pair of substrates;
an element sealed in the internal space and surrounded by the pair of substrates;
an adsorption layer within the internal space and opposing at least one substrate of the pair of substrates, the adsorption layer constructed to adsorbs at least hydrogen; and
a diffusion-inhibiting layer between the at least one substrate and the adsorption layer, and in which hydrogen is more difficult to diffuse compared with in the at least one substrate.

2. The package structure according to claim 1, wherein the hydrogen is more difficult to diffuse in the diffusion-inhibiting layer compared with in the adsorption layer.

3. The package structure according to claim 1, wherein the diffusion-inhibiting layer contains a titanium silicon alloy.

4. The package structure according to claim 1, wherein the diffusion-inhibiting layer contains titanium oxide.

5. The package structure according to claim 1, wherein the adsorption layer contains titanium.

6. The package structure according to claim 1, wherein the at least one substrate includes a silicon layer.

7. The package structure according to claim 6, wherein the at least one substrate further includes a silicon oxide layer disposed on a side of the silicon layer adjacent the adsorption layer.

8. The package structure according to claim 7, wherein a thickness of the silicon oxide layer is 5 nm or less.

9. The package structure according to claim 1, wherein the diffusion-inhibiting layer is on a surface of the at least one substrate.

10. The package structure according to claim 1, wherein at least a portion of the diffusion-inhibiting layer is within a surface of the at least one substrate.

11. The package structure according to claim 1, wherein the bonding portion contains at least one of aluminum, copper, silicon, germanium, titanium, gold, and tin.

12. The package structure according to claim 1, wherein the element is a vibration element with a frequency band of 1 kHz to 1 MHz.

13. A method for manufacturing a package structure, the method comprising:
forming an adsorption layer which adsorbs at least hydrogen on at least one substrate of a pair of substrates;
forming, on the at least one substrate, a diffusion-inhibiting layer in which hydrogen is more difficult to diffuse compared with in the at least one substrate;
arranging the pair of substrates such that the adsorption layer on the at least one substrate opposes the other substrate; and
sealing an element in an internal space surrounded by the pair of substrates by forming a bonding portion between the pair of substrates.

14. The method for manufacturing the package structure according to claim 13, wherein the hydrogen is more difficult to diffuse in the diffusion-inhibiting layer compared with in the adsorption layer.

15. The method for manufacturing the package structure according to claim 13,
wherein the adsorption layer is formed on the at least one substrate, and
after the forming of the adsorption layer, the diffusion-inhibiting layer is derived from a material contained in the at least one substrate and a material contained in the adsorption layer by a heat treatment.

16. The method for manufacturing the package structure according to claim 15, wherein the heat treatment is performed for at least 1 hour.

17. The method for manufacturing the package structure according to claim 15, the method further comprising:
activating the adsorption layer,
wherein the heat treatment is performed in the activating of the adsorption layer.

18. The method for manufacturing the package structure according to claim 15, wherein the heat treatment is performed in the forming of the bonding portion.

19. The method for manufacturing the package structure according to claim 17,
wherein the at least one substrate includes a silicon layer,
the forming of the adsorption layer includes forming titanium on the silicon layer, and
the heat treatment is performed at 450° C. to 700° C.

20. The method for manufacturing the package structure according to claim 17,
wherein the at least one substrate includes a silicon layer and a silicon oxide layer formed on the silicon layer,
the forming of the adsorption layer includes forming titanium on the silicon oxide layer, and
the heat treatment is performed at 400° C. to 700° C.

* * * * *